US012009308B2

(12) United States Patent
Son

(10) Patent No.: US 12,009,308 B2
(45) Date of Patent: Jun. 11, 2024

(54) SEMICONDUCTOR CHIP INCLUDING THROUGH ELECTRODES, AND SEMICONDUCTOR PACKAGE INCLUDING THE SAME

(71) Applicant: SK hynix Inc., Icheon-si (KR)

(72) Inventor: Ho Young Son, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 298 days.

(21) Appl. No.: 17/317,558

(22) Filed: May 11, 2021

(65) Prior Publication Data

US 2022/0208682 A1  Jun. 30, 2022

(30) Foreign Application Priority Data

Dec. 30, 2020 (KR) .................. 10-2020-0186907

(51) Int. Cl.
*H01L 23/538* (2006.01)
*H01L 23/50* (2006.01)
*H01L 23/528* (2006.01)
*H01L 25/065* (2023.01)
(Continued)

(52) U.S. Cl.
CPC .......... *H01L 23/5384* (2013.01); *H01L 23/50* (2013.01); *H01L 23/5286* (2013.01); *H01L 23/5386* (2013.01); *H01L 25/0657* (2013.01); *H01L 23/481* (2013.01);
(Continued)

(58) Field of Classification Search
CPC ............. H01L 25/0657; H01L 25/0652; H01L 25/043; H01L 25/071; H01L 25/074; H01L 25/0756; H01L 25/112; H01L 25/117; H01L 2224/08145; H01L 27/0688;
(Continued)

(56) References Cited

U.S. PATENT DOCUMENTS

2010/0261318 A1* 10/2010 Feng .................. H01L 23/5256
257/E21.602
2013/0313690 A1* 11/2013 Miyazaki .......... H01L 21/76898
257/621
(Continued)

FOREIGN PATENT DOCUMENTS

KR  101481571 B1  1/2015

*Primary Examiner* — Younes Boulghassoul
*Assistant Examiner* — Quinton A Brasfield
(74) *Attorney, Agent, or Firm* — WILLIAM PARK & ASSOCIATES LTD.

(57) ABSTRACT

A semiconductor chip according to an embodiment includes a body portion with a front surface and a rear surface, the body portion being oriented in such a way that the rear surface is above the front surface, first and second through electrodes penetrating the body portion with protrusions that protrude above the rear surface of the body portion, a wiring portion formed under the front surface of the body portion, a power pattern formed over the rear surface of the body portion and spaced apart from the protrusions, an interlayer insulating layer filling spaces between the power pattern and the protrusions, and first and second rear connection electrodes formed over the interlayer insulating layer and respectively connected to the first and second through electrodes, wherein the first rear connection electrode is simultaneously connected to the first through electrode and a part of the power pattern that is adjacent to the first through electrode.

38 Claims, 23 Drawing Sheets

(51) Int. Cl.
 *H01L 23/48* (2006.01)
 *H01L 23/498* (2006.01)
(52) U.S. Cl.
 CPC ................ *H01L 23/49827* (2013.01); *H01L 2224/08146* (2013.01); *H01L 2225/06541* (2013.01)
(58) Field of Classification Search
 CPC ....... H01L 23/5286; H01L 2224/08146; H01L 23/528–5286
 See application file for complete search history.

(56) References Cited

U.S. PATENT DOCUMENTS

| | | | | |
|---|---|---|---|---|
| 2015/0008588 A1* | 1/2015 | Kim | ...................... | H01L 23/373 257/774 |
| 2015/0123278 A1* | 5/2015 | Park | ........................ | H01L 24/03 257/774 |
| 2015/0187733 A1* | 7/2015 | Batra | .................. | H01L 25/0657 438/109 |
| 2015/0270220 A1* | 9/2015 | Moon | ................. | H01L 21/0337 257/737 |
| 2020/0243516 A1 | 7/2020 | Thei et al. | | |

\* cited by examiner

SEMICONDUCTOR CHIP INCLUDING THROUGH ELECTRODES, AND SEMICONDUCTOR PACKAGE INCLUDING THE SAME

CROSS-REFERENCE TO RELATED APPLICATION

This application claims priority under 35 U.S.C. § 119 to Korean Patent Application No. 10-2020-0186907 filed on Dec. 30, 2020, which is incorporated herein by reference in its entirety.

BACKGROUND

1. Technical Field

This patent document relates to a semiconductor technology, and more particularly, to a semiconductor chip including through electrodes and a semiconductor package including the same.

2. Related Art

Electronic products require high-volume data processing even as their sizes get progressively smaller. Accordingly, semiconductor chips that are used in such electronic products are also required to be thin and small in size. Further, a semiconductor package in which a plurality of semiconductor chips are embedded has been manufactured.

The plurality of semiconductor chips may be stacked in a vertical direction and may be electrically connected to each other with through electrodes passing through the semiconductor chips.

SUMMARY

In an embodiment, a semiconductor chip may include: a body portion with a front surface and a rear surface, the body portion being oriented in such a way that the rear surface is above the front surface; first and second through electrodes penetrating the body portion with protrusions that protrude above the rear surface of the body portion; a power pattern formed over the rear surface of the body portion and spaced apart from the protrusions; an interlayer insulating layer filling spaces between the power pattern and the protrusions; and first and second rear connection electrodes formed over the interlayer insulating layer and respectively connected to the first and second through electrodes, wherein the first rear connection electrode is simultaneously connected to the first through electrode and a part of the power pattern that is adjacent to the first through electrode.

In another embodiment, a semiconductor package may include: a first semiconductor chip including a body portion with a front surface and a rear surface, the body portion being oriented in such a way that the rear surface is above the front surface, first and second through electrodes penetrating the body portion with protrusions that protrude above the rear surface of the body portion, a power pattern formed over the rear surface of the body portion and spaced apart from the protrusions, an interlayer insulating layer filling spaces between the power pattern and the protrusions, first and second rear connection electrodes formed over the interlayer insulating layer and respectively connected to the first and second through electrodes, and a rear insulating layer formed over the interlayer insulating layer and the power pattern, filling a space between the first and second rear connection electrodes, wherein the first rear connection electrode is simultaneously connected to the first through electrode and a part of the power pattern that is adjacent to the first through electrode; and a second semiconductor chip including front connection electrodes directly bonded to the first and second rear connection electrodes, respectively, and a front insulating layer directly bonded to the rear insulating layer while filling spaces between the front connection electrodes.

In another embodiment, a semiconductor chip may include: a body portion with a front surface and a rear surface, the body portion being oriented in such a way that the rear surface is above the front surface; first and second through electrodes penetrating the body portion; a power pattern formed over the rear surface of the body portion and spaced apart from the first and second through electrodes; first and second connection patterns formed over the rear surface of the body portion and respectively connected to the first and second through electrodes; an interlayer insulating layer filling spaces between the power pattern and the first and second connection patterns; and first and second rear connection electrodes formed over the interlayer insulating layer and respectively connected to the first and second connection patterns, wherein the first rear connection electrode is simultaneously connected to the first connection pattern and a part of the power pattern that is adjacent to the first connection pattern.

In another embodiment, a semiconductor package may include: a first semiconductor chip including a body portion with a front surface and a rear surface, the body portion being oriented in such a way that the rear surface is above the front surface, first and second through electrodes penetrating the body portion, a power pattern formed over the rear surface of the body portion and spaced apart from the first and second through electrodes; first and second connection patterns formed over the rear surface of the body portion and respectively connected to the first and second through electrodes, an interlayer insulating layer filling spaces between the power pattern and the first and second connection patterns, first and second rear connection electrodes formed over the interlayer insulating layer and respectively connected to the first and second connection patterns, and a rear insulating layer formed over the interlayer insulating layer and the power pattern, filling a space between the first and second rear connection electrodes, where the first rear connection electrode is simultaneously connected to the first through electrode and a part of the power pattern that is adjacent to the first through electrode; and a second semiconductor chip including front connection electrodes directly bonded to the first and second rear connection electrodes, respectively, and a front insulating layer directly bonded to the rear insulating layer while filling spaces between the front connection electrodes.

DETAILED DESCRIPTION

Figure 1A:
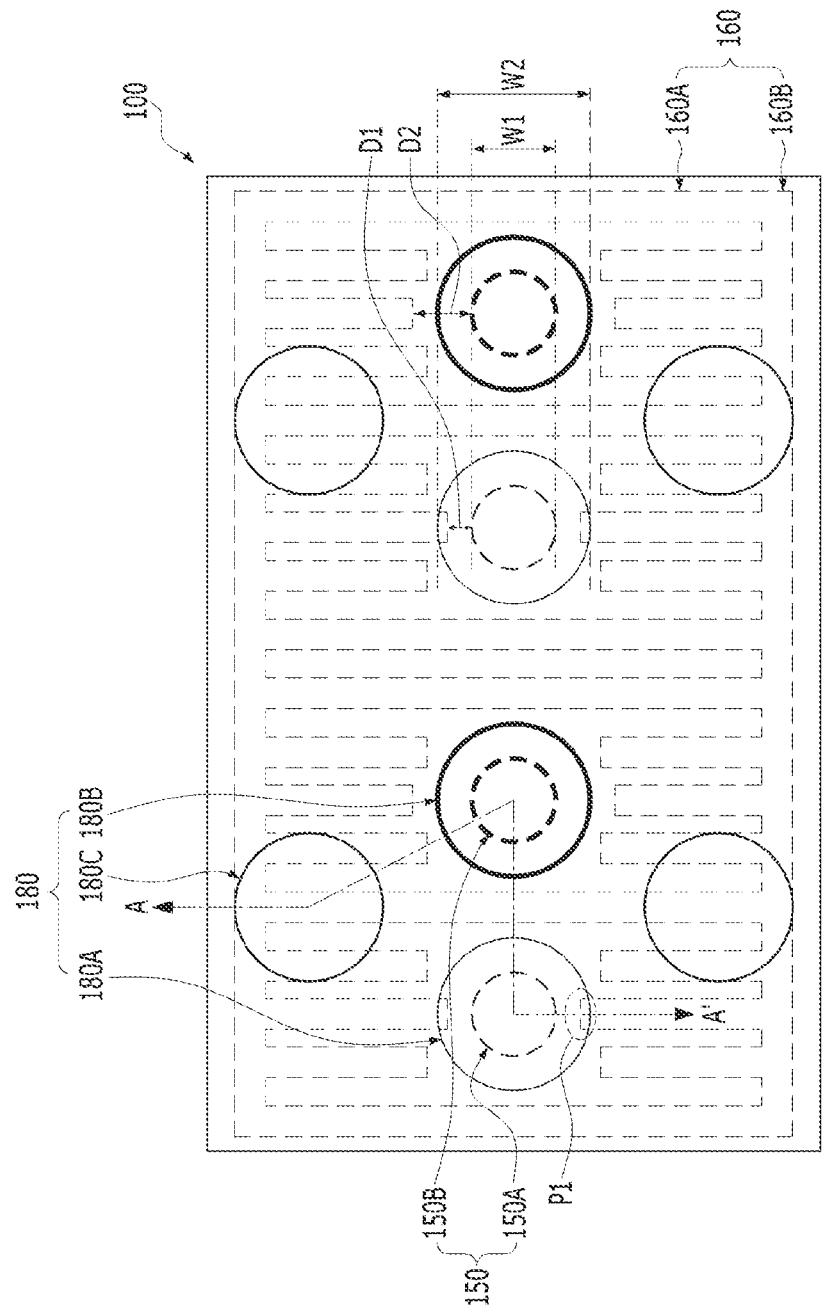
FIGS. 1A and 1B are views illustrating a semiconductor chip according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period in which the process or the algorithm is executed.

Figure 1B:
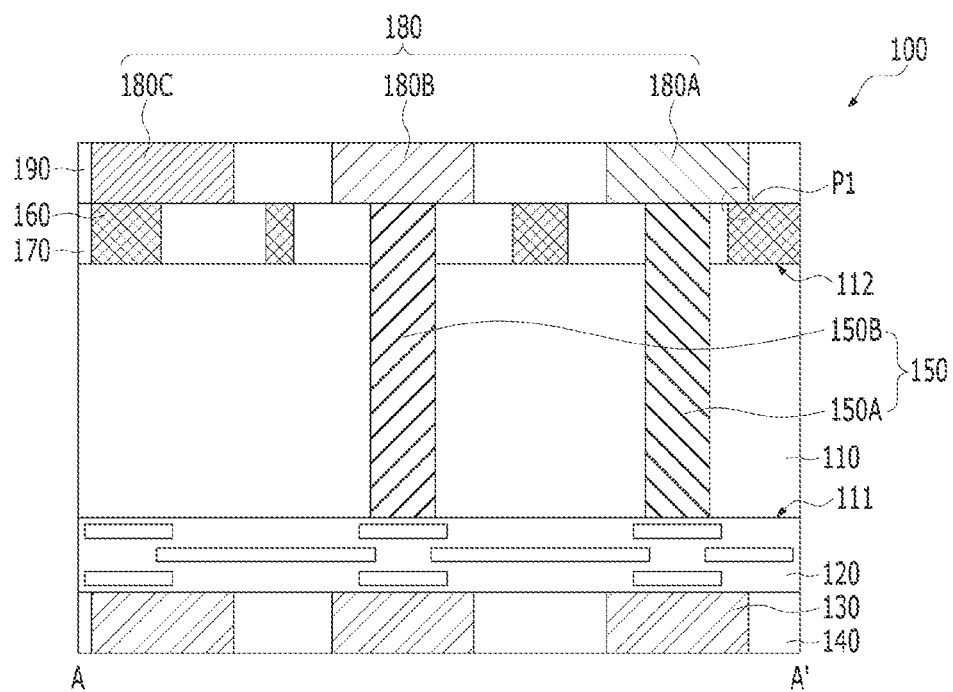

FIGS. 1A and 1B are views illustrating a semiconductor chip according to an embodiment of the present disclosure. FIG. 1A is a plan view of the semiconductor chip of the present embodiment as viewed from above, and FIG. 1B is a cross-sectional view taken along a line A-A' of FIG. 1A. In FIG. 1A, for convenience of description, a through electrode and a power pattern disposed under a rear connection electrode are shown in dotted lines, together with the rear connection electrode disposed at the uppermost portion of the semiconductor chip.

Referring to FIGS. 1A and 1B, a semiconductor chip 100 of the present embodiment may include a body portion 110, a wiring portion 120, a front connection electrode 130, a front insulating layer 140, a through electrode 150, a power pattern 160, an interlayer insulating layer 170, a rear connection electrode 180, and a rear insulating layer 190.

The body portion 110 may be formed of a semiconductor material, such as silicon or germanium, and may have a front surface 111, a rear surface 112, and a side surface connecting them to each other. The front surface 111 of the body portion 110 may refer to an active surface on which the wiring portion 120 is disposed, and the rear surface 112 of the body portion 110 may refer to a surface that is located on the opposite side of the front surface 111.

The wiring portion 120 may be formed under the front surface 111 of the body portion 110. The wiring portion 120 may include a circuit/wiring structure that is electrically connected to the through electrode 150. For convenience of description, the circuit/wiring structure is simply illustrated as lines in the wiring portion 120, but is not limited to the illustrated one. In this case, the circuit/wiring structure may be variously implemented according to the type of the semiconductor chip 100. For example, when the semiconductor chip 100 includes volatile memory, such as dynamic random access memory (DRAM) and static random access memory (SRAM), or nonvolatile memory, such as NAND flash, resistive random access memory (RRAM), phase-change random access memory (PRAM), magneto-resistive random access memory (MRAM), and ferroelectric random access memory (FRAM), the circuit/wiring structure may include a memory cell array with a plurality of memory cells.

The front connection electrode 130 may be formed under the wiring portion 120. The front connection electrode 130 may be for electrically connecting the semiconductor chip 100 to another component (not shown) that will face the front surface 111, for example, another semiconductor chip or a substrate. The front connection electrode 130 may include a metal, such as copper (Cu), nickel (Ni), tin (Sn), gold (Au), silver (Ag), or a combination thereof, or a compound of this metal, and may have a single-layered structure or a multi-layered structure. In particular, when the front connection electrode 130 is directly bonded to a rear connection electrode of another semiconductor chip (not shown) to form a hybrid bonding structure, the front connection electrode 130 may include a metal material that can be bonded to the rear connection electrode by interdiffusion of metals through a high-temperature annealing process.

The front connection electrode 130 may be electrically connected to the wiring portion 120. Furthermore, the front connection electrode 130 may be electrically connected to the through electrode 150 through the wiring portion 120.

The front insulating layer 140 may be formed under the wiring portion 120 to fill the spaces between the front connection electrodes 130. The front insulating layer 140 may include various insulating materials. In particular, when the front insulating layer 140 is directly bonded to a rear insulating layer of another semiconductor chip (not shown) to form a hybrid bonding structure, the front insulating layer 140 may include an insulating material that can be bonded to a rear insulating layer through covalent bonding between insulating materials. For example, the front insulating layer 140 may include silicon oxide or silicon nitride. One surface of the front connection electrode 130 and one surface of the front insulating layer 140 that do not face the wiring portion 120 may be substantially coplanar.

The through electrode 150 may have a pillar shape that extends from the front surface 111 to the rear surface 112 of the body portion 110 and penetrating the body portion 110. In addition, the through electrode 150 may protrude above the rear surface 112 of the body portion 110 to further penetrate the interlayer insulating layer 170 that is formed over the rear surface 112 of the body portion 110. As an example, the through electrode 150 may include TSV (Through Silicon Via). The through electrode 150 may include various conductive materials. As an example, the through electrode 150 may include a metal, such as copper (Cu), tin (Sn), silver (Ag), tungsten (W), nickel (Ni), ruthenium (Ru), cobalt (Co), or a combination thereof, or a compound of this metal. One end of the through electrode 150 may be connected to a part of the circuit/wiring structure of the wiring portion 120, and the other end of the through electrode 150 may be connected to the rear connection electrode 180. In a plan view, the width of each through electrode 150 is indicated by a reference numeral W1.

The through electrode 150 may include a first through electrode 150A that is electrically connected to the power pattern 160 and a second through electrode 150B that is not electrically connected to the power pattern 160. Power, for example, various levels of power voltages or a ground voltage, may be supplied through the first through electrode 150A. In this case, the power that is applied to the first through electrode 150A may be the same as the power that is applied to the power pattern 160. In addition, various levels of power may be supplied through the second through electrode 150B or various signals required for driving the semiconductor chip 100 may be transmitted through the second through electrode 150B. In this case, the power that is applied to the second through electrode 150B may be different from the power that is applied to the first through electrode 150A and the power pattern 160. For example, a potential value that is applied to the second through electrode 150B may be different from a potential value that is applied to the first through electrode 150A and the power pattern 160.

The power pattern 160 may be formed over the rear surface 112 of the body portion 110 to be spaced apart from the through electrode 150 in the horizontal direction. The power pattern 160 may be electrically connected to the first through electrode 150A through the first rear connection electrode 180A and may be electrically insulated from the second through electrode 150B. The power pattern 160 may include various conductive materials. As an example, the power pattern 160 may include a metal, such as copper (Cu), nickel (Ni), tin (Sn), gold (Au), silver (Ag), or a combination thereof, or a compound of this metal.

In the present embodiment, in a plan view, the power pattern 160 may include a plurality of line patterns 160A that are arranged along one direction and an extension pattern 160B that connects ends of the plurality of line patterns 160A to each other. The interlayer insulating layer 170 may fill the spaces between the plurality of line patterns 160A. That is, the plurality of line patterns 160A may be alternately arranged with the interlayer insulating layer 170. In this case, the area in which the interlayer insulating layer 170 is formed may be increased compared to a case in which a power pattern with a flat plate shape is formed, so that the adhesion property between a layer in which the power pattern 160 is formed and a layer formed thereon, for example, a layer in which the rear connection electrode 180 and the rear insulating layer 190 are formed, may be improved. However, the present disclosure is not limited thereto, and the power pattern 160 may have various planar shapes on the assumption that it is spaced apart from the through electrode 150.

Through the power pattern 160A, two or more first through electrodes 150A may be electrically connected to each other to form a power distribution network (PDN), and thus, stable power supply through the first through electrodes 150A may be possible.

The interlayer insulating layer 170 may be formed over the rear surface 112 of the body portion 110 to fill the space between the through electrode 150 and the power pattern 160. The interlayer insulating layer 170 may include various insulating materials, such as silicon oxide, silicon nitride, or a combination thereof. In addition, the interlayer insulating layer 170 may have a single-layered structure or a multi-layered structure. One surface of the through electrode 150, one surface of the power pattern 160, and one surface of the interlayer insulating layer 170 that do not face the rear surface 112 of the body portion 110, may form a substantially flat surface.

The rear connection electrode 180 may be formed over the flat surface that is formed based on the one surface of the through electrode 150, the one surface of the power pattern 160, and the one surface of the interlayer insulating layer 170. The rear connection electrode 180 may be for electrically connecting the semiconductor chip 100 to another component (not shown) that will face the rear surface 112, for example, another semiconductor chip. The rear connection electrode 180 may include a metal, such as copper (Cu), nickel (Ni), tin (Sn), gold (Au), silver (Ag), or a combination thereof, or a compound of this metal, and may have a single-layered structure or a multi-layered structure. The rear connection electrode 180 may be formed of the same material as the front connection electrode 130. In particular, when the rear connection electrode 180 is directly bonded to a front connection electrode of another semiconductor chip (not shown) to form a hybrid bonding structure, the rear connection electrode 180 may include a metal material that can be bonded to the front connection electrode through the interdiffusion of metals through a high-temperature annealing process. In a plan view, the width of each rear connection electrode 180 is indicated by a reference numeral W2.

The rear connection electrode 180 may include a first rear connection electrode 180A that is connected to the first through electrode 150A, a second rear connection electrode 180B that is connected to the second through electrode 150B, and a third rear connection electrode 180C that is not connected to the through electrode 150.

The first rear connection electrode 180A may be formed to overlap and connect with each first through electrode 150A. The first rear connection electrode 180A may correspond to the first through electrode 150A in one-to-one correspondence. Furthermore, the first rear connection electrode 180A may simultaneously overlap and connect with a part of the power pattern 160 that is adjacent to the first through electrode 150A (see P1). To this end, the width W2 of the first rear connection electrode 180A may have a value that is greater than the sum of the width W1 of the first through electrode 150A, and the minimum distance D1 between the first through electrode 150A and the power pattern 160 adjacent thereto. As a result, the first rear connection electrode 180A may electrically connect the first through electrode 150A to the power pattern 160, and the power that is applied to the first through electrode 150A and the power pattern 160 may be supplied to the first rear connection electrode 180A.

The second rear connection electrode 180B may be formed to overlap and connect with each second through electrode 150B. The second rear connection electrode 180B may correspond to the second through electrode 150B in one-to-one correspondence. The second rear connection electrode 180B might not overlap/connect with the power pattern 160 around the second through electrode 150B. To this end, the power pattern 160 may be arranged so that the minimum distance D2 between the second through electrode 150B and the power pattern 160 adjacent thereto is greater than the minimum distance D1 between the first through electrode 150A and the power pattern 160 adjacent thereto. That is, the width W2 of the second rear connection electrode 180B may have a value that is less than the sum of the width W1 of the second through electrode 150B, and the minimum distance D2 between the second through electrode 150B and the power pattern 160 adjacent thereto. The power or signal applied to the second through electrode 150B may be supplied or transmitted to the second rear connection electrode 180B.

The third rear connection electrode 180C may be formed to be spaced apart from the first and second rear connection electrodes 180A and 180B without overlapping or connecting with the through electrode 150. The third rear connection electrode 180C may be a dummy that is not used for signal transmission or power supply. In the present embodiment, the third rear connection electrode 180C may be applied with the same power as the power pattern 160 by overlapping and connecting with the power pattern 160. However, if the third rear connection electrode 180C is in a floating state that is not electrically connected to other wiring except for the power pattern 160, the third rear connection electrode 180C might not perform a function of signal transmission or power supply. Further, as described later, even if the third rear connection electrode 180C is connected to a front connection electrode of another semiconductor chip (see 130 in FIG. 2), the third rear connection electrode 180C might not perform a function of signal transmission or power supply in a case that the third rear connection electrode 180C is in a floating state that is not electrically connected to other wiring except for the power pattern 160. In another embodiment, unlike the illustration, the third rear connection electrode 180C might not overlap/connect with the power pattern 160. That is, the third rear connection electrode 180C may be formed in a region in which the power pattern does not exist, and thus may have an electrically floating state. The third rear connection electrode 180C may perform various functions. As an example, the third rear connection electrode 180C may function to facilitate processes, such as being used as a stop layer during a planarization process when stacking a plurality of semiconductor chips 100. As another example, the third rear connection electrode 180C may function to improve heat generation characteristics in a semiconductor package with the plurality of semiconductor chips 100. The third rear connection electrode 180C may be omitted.

The front connection electrodes 130 and the rear connection electrodes 180 may have the same arrangement. That is, the plurality of front connection electrodes 130 and the plurality of rear connection electrodes 180 may overlap each other in a plan view.

The rear insulating layer 190 may be formed over the flat surface that is formed based on the one surface of the through electrode 150, the one surface of the power pattern 160, and the one surface of the interlayer insulating layer 170 to fill the spaces between the rear connection electrodes 180. The rear insulating layer 190 may include various insulating materials. The rear insulating layer 190 may be formed of the same material as the front insulating layer 140. In particular, when the rear insulating layer 190 is directly bonded to a front insulating layer of another semiconductor chip (not shown) to form a hybrid bonding structure, the rear insulating layer 190 may include an insulating material that can be bonded to a front insulating layer through covalent bonding between insulating materials. For example, the rear insulating layer 190 may include silicon oxide or silicon nitride. One surface of the rear connection electrode 180 and one surface of the rear insulating layer 190 that do not face the above-described flat surface may be substantially coplanar.

According to the semiconductor chip 100 that is described above, the first rear connection electrode 180A may be connected to the corresponding first through electrode 150A and the power pattern 160 adjacent thereto at the same time. Furthermore, the first rear connection electrode 180A may directly contact the corresponding first through electrode 150A and the power pattern 160 adjacent thereto. Accordingly, because the two or more first through electrodes 150A form the PDN through the first rear connection electrode 180A and the power pattern 160, power may be easily and stably supplied. In particular, when the plurality of semiconductor chips 100 are stacked in the vertical direction, power supply through the plurality of semiconductor chips 100 may be more efficiently performed.

In addition, when the plurality of semiconductor chips 100 are stacked in the vertical direction, a hybrid bonding structure that firmly bonds adjacent semiconductor chips 100 in the vertical direction may be provided. This will be described in more detail with reference to FIG. 2 below.

Figure 2:
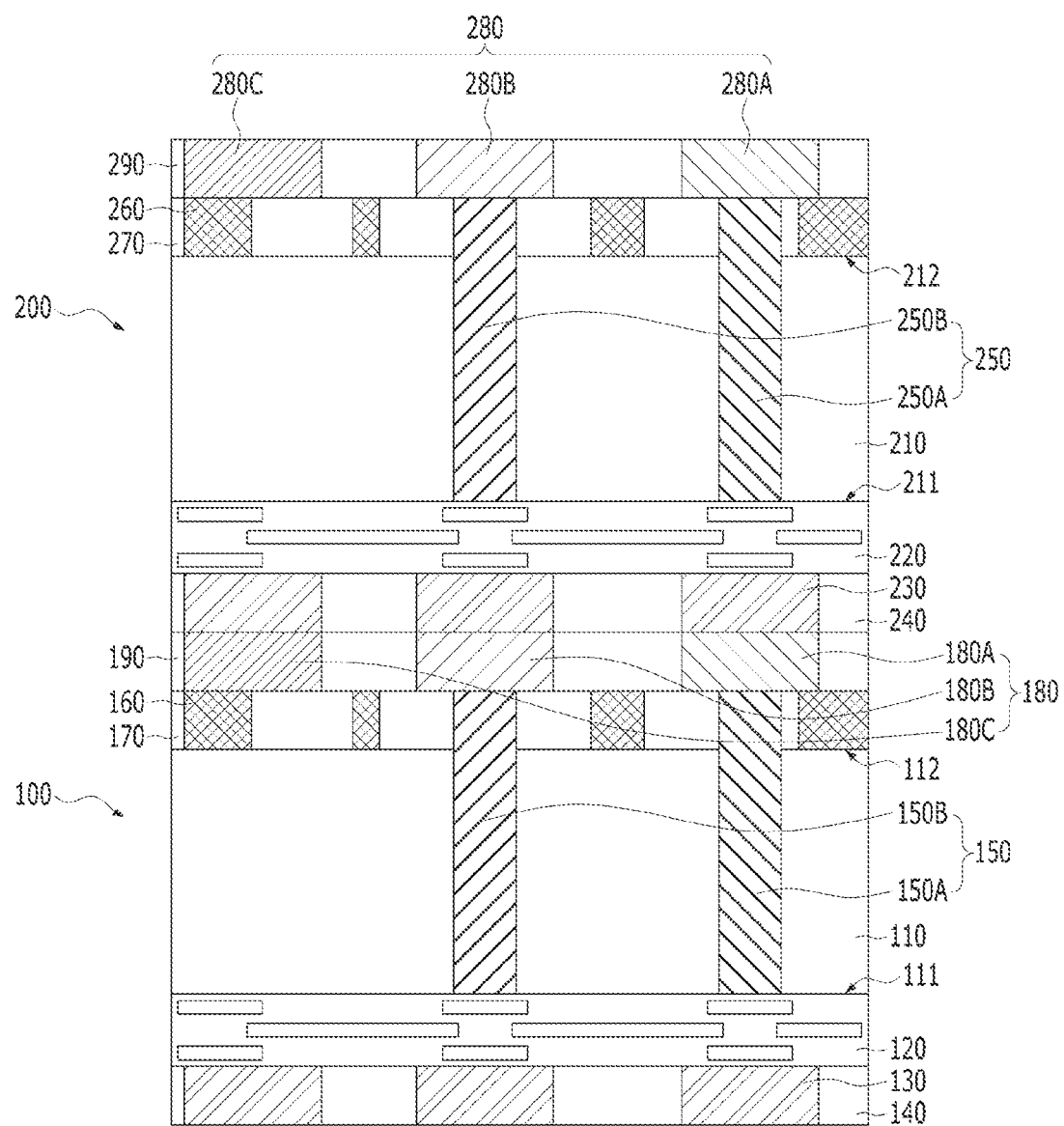
FIG. 2 is a cross-sectional view illustrating stacked semiconductor chips according to an embodiment of the present disclosure.

FIG. 2 is a cross-sectional view illustrating stacked semiconductor chips according to an embodiment of the present disclosure. FIG. 2 shows a case in which two semiconductor chips are stacked in a vertical direction.

Referring to FIG. 2, a first semiconductor chip 100 may be substantially the same as the semiconductor chip 100 of FIGS. 1A-1B described above. Accordingly, the same reference numerals as those of FIGS. 1A-1B are used.

A second semiconductor chip 200 may also be substantially the same as the semiconductor chip 100 of FIGS. 1A-1B described above. That is, the second semiconductor chip 200 may include a body portion 210 with a front surface 211 and a rear surface 212, the body portion being oriented in such a way that the rear surface 212 is above the front surface 211 in the embodiment, a wiring portion 220 that is disposed over the front surface 211 of the body portion 210, front connection electrodes 230 that is disposed over the wiring portion 220 and electrically connected to through electrodes 250 through the wiring portion 220, a front insulating layer 240 that is disposed over the wiring portion 220 and filling the spaces between the front connection electrodes 230, the through electrodes 250 that penetrate the body portion 210 and protrude above the rear surface 212 of the body portion 210, a power pattern 260 that is disposed over the rear surface 212 of the body portion 210, an interlayer insulating layer 270 that is disposed over the rear surface 212 of the body portion 210 and filling the spaces between the through electrodes 250 and the power pattern 260, rear connection electrodes 280 that is disposed over the interlayer insulating layer 270, and a rear insulating layer 290 that is disposed over the interlayer insulating layer 270 and filling the spaces between the rear connection electrodes 280. The through electrodes 250 may include a first through electrode 250A that is electrically connected to the power pattern 260 and a second through electrode 250B that is not electrically connected to the power pattern 260. The rear connection electrodes 280 may include a first rear connection electrode 280A that is simultaneously connected to the first through electrode 250A and the power pattern 260, a second rear connection electrode 280B that is connected to the second through electrode 250B while not being connected to the power pattern 260, and a third rear connection electrode 280C that is not connected to the through electrodes 250.

The second semiconductor chip 200 may be stacked over the first semiconductor chip 100 with the front surface 211 thereof that faces the rear surface 112 of the first semiconductor chip 100. In this case, the rear connection electrode 180 of the first semiconductor chip 100 may be directly bonded to the front connection electrode 230 of the second semiconductor chip 200, and the rear insulating layer 190 of the first semiconductor chip 100 may be directly bonded to the front insulating layer 240 of the second semiconductor chip 200. This may be implemented by performing a high-temperature annealing process in a state in which the rear connection electrode 180 and the rear insulating layer 190 of the first semiconductor chip 100 are in contact with the front connection electrode 230 and the front insulating layer 240 of the second semiconductor chip 200, respectively. During the high-temperature annealing process, metals for forming the rear connection electrode 180 of the first semiconductor chip 100 and the front connection electrode 230 of the second semiconductor chip 200 may be bonded to each other through the interdiffusion of the metals, for example, the interdiffusion of copper. At this time, insulating materials for forming the rear insulating layer 190 of the first semiconductor chip 100 and the front insulating layer 240 of the second semiconductor chip 200 may be bonded to each other through the covalent bonding of the insulating materials, for example, the covalent bonding that is formed between silicon oxide or silicon nitride. Accordingly, hybrid bonding between the first semiconductor chip 100 and the second semiconductor chip 200 may be performed. That is, bonding of a metal and a metal, and bonding of an insulating layer and an insulating layer may be performed in-situ.

Each of the first to third rear connection electrodes 180A, 180B, and 180C of the first semiconductor chip 100 may be bonded to a corresponding front connection electrode 230 of the second semiconductor chip 200. In this case, the arrangement of the first to third rear connection electrodes 180A, 180B, and 180C may be substantially the same as the arrangement of the front connection electrodes 230. In a plan view, each of the first to third rear connection electrodes 180A, 180B, and 180C may overlap the corresponding front connection electrode 230. The third rear connection electrode 180C of the first semiconductor chip 100 may be omitted. In this case, the front connection electrode 230 of the second semiconductor chip 200 corresponding to the third rear connection electrode 180C may also be omitted. According to an embodiment, power is supplied to the first semiconductor chip 100 and the second semiconductor chip 200 through the first through electrode 150A, the power pattern 160, the first rear connection electrode 180A, and the front connection electrode 230 that is connected to the first rear connection electrode 180A and a signal is transmitted to the first semiconductor chip 100 and the second semiconductor chip 200 through the second through electrode 150B, the second rear connection electrode 180B, and the front connection electrode 230 that is connected to the second rear connection electrode 180B. According to an embodiment, power that is supplied to the first semiconductor chip 100 and the second semiconductor chip 200 through the first through electrode 150A, the power pattern 160, the first rear connection electrode 180A, and the front connection electrode 230 that is connected to the first rear connection electrode 180A, is different from is different from power that is supplied to the first semiconductor chip 100 and the second semiconductor chip 200 through the second through electrode 150B, the second rear connection electrode 180B, and the front connection electrode 230 that is connected to the second rear connection electrode 180B.

According to the embodiment described above, firm bonding between the first semiconductor chip 100 and the second semiconductor chip 200 may be possible by forming a hybrid bonding structure. In addition, because the electrical connection between the first semiconductor chip 100 and the second semiconductor chip 200 is achieved without connection bumps, the power supply path or the signal transmission path therebetween may be shortened. As a result, power supply delay or signal transmission delay may be reduced thereby improving the operating characteristics of the first and second semiconductor chips 100 and 200. In addition, because the space between the first semiconductor chip 100 and the second semiconductor chip 200 for arranging the bumps is not required, a decrease in heat transfer efficiency caused by filling the space with an insulating material may be reduced.

Further, by not disposing the power patterns 160 and 260 on a surface, the influence on the interfacial bonding force of the hybrid bonding structure may be minimized. The interfacial bonding force of the hybrid bonding structure may be defined as the sum of the covalent bonding force between the insulating layer and the insulating layer and the intermetallic bonding force between the metal and the metal. Because the covalent bonding force is stronger than the intermetallic bonding force, when the area that is occupied by the insulating layer at the bonding interface decreases, the overall interfacial bonding force may also decrease. If the power pattern is formed at the same level as the rear connection electrode, that is, in the rear insulating layer, the contact area between the rear insulating layer of the lower semiconductor chip and the front insulating layer of the upper semiconductor chip may decrease, and thus, the interfacial bonding force between them may decrease.

FIGS. 3A to 3F are cross-sectional views illustrating a method for fabricating a semiconductor chip according to an embodiment of the present disclosure.

Figure 3A:
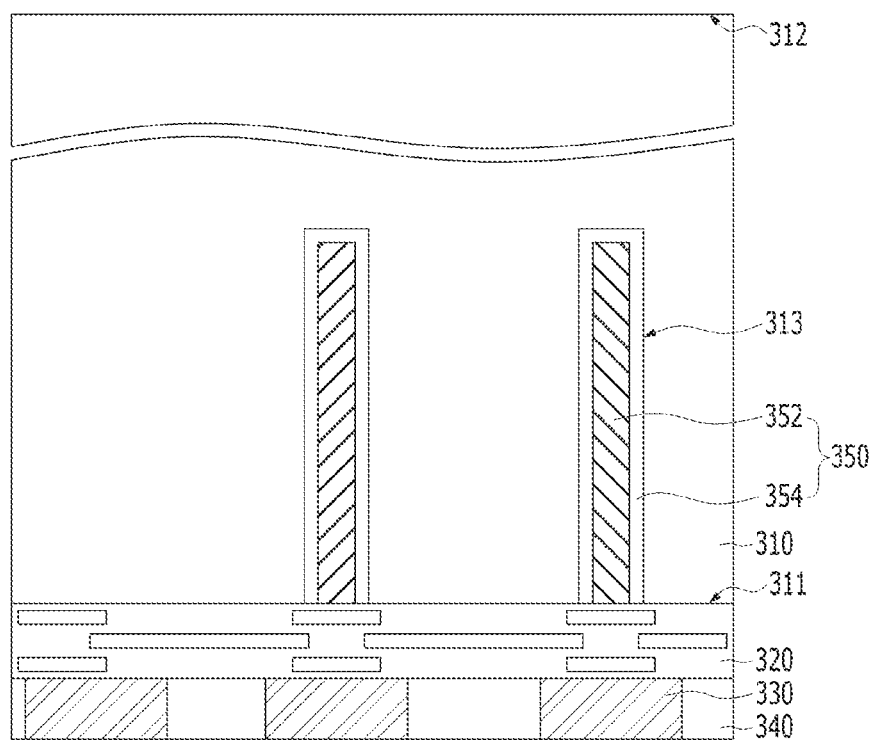
FIGS. 3A to 3F are cross-sectional views illustrating a method for fabricating a semiconductor chip according to an embodiment of the present disclosure.

Referring to FIG. 3A, a structure with an initial body portion 310 that has a front surface 311 and an initial rear surface 312 and has an initial through electrode 350 formed therein, a wiring portion 320 that is formed under the front surface 311 of the initial body portion 310, and a front connection electrode 330 and a front insulating layer 340 that are formed under the wiring portion 320, may be formed over a carrier substrate (not shown). The initial through electrode 350 may include an initial conductive pillar 352 and an initial spacer 354 that surrounds a side surface and an upper surface of the initial conductive pillar 352. The method of forming this structure will be described in more detail below.

First, the initial body portion 310 with the front surface 311 and the initial rear surface 312 may be provided. The initial rear surface 312 may have a greater distance from the front surface 311 than the rear surface 112 of FIG. 1B, and accordingly, the initial body portion 310 may have a greater thickness than the body portion 110 of FIG. 1B.

Subsequently, the initial body portion 310 may be etched to form a hole 313 in the initial body portion 310. The hole 313 may be formed at a predetermined depth from the front surface 311 of the initial body portion 310 toward the initial rear surface 312. The depth of the hole 313 may be less than the thickness of the initial body portion 310.

Subsequently, the initial spacer 354 may be formed along the inner wall of the hole 313, and the hole 313 in which the initial spacer 354 is formed may be filled with a conductive material to form the initial conductive pillar 352. Therefore, the initial through electrode 350 may be formed. The initial conductive pillar 352 may include a metal or a metal compound, and the initial spacer 354 may include silicon oxide, silicon nitride, metal nitride, or the like.

Subsequently, the wiring portion 320 may be formed under the front surface 311 of the initial body portion 310 in which the initial through electrode 350 is formed, and the front connection electrode 330 and the front insulating layer 340 may be formed under the wiring portion 320. Therefore, the structure of FIG. 3A may be obtained.

Figure 3B:
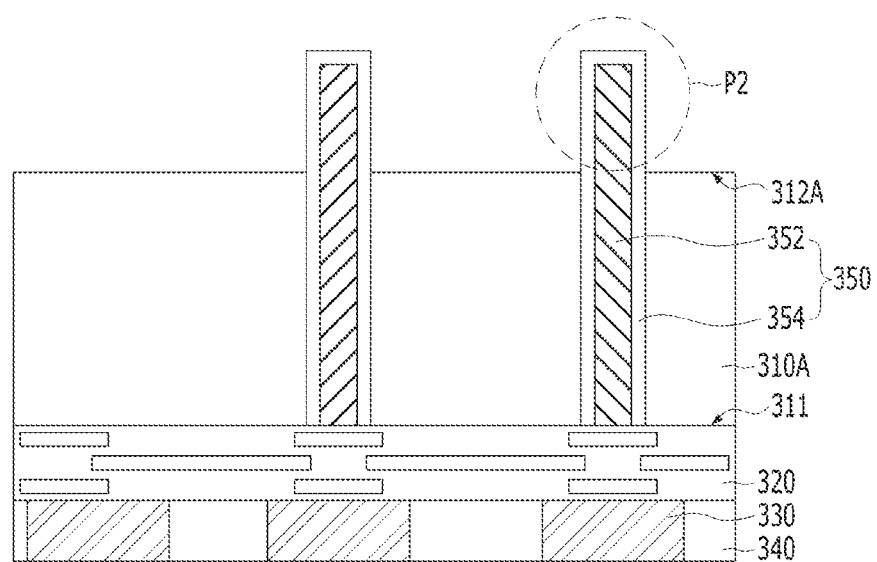

Referring to FIG. 3B, a part of the initial body portion 310 may be removed to form a body portion 310A, which is thinner the initial body portion 310. That is, a thinning process may be performed.

The thinning process may be performed on the initial rear surface 312 of the initial body portion 310. Accordingly, the body portion 310A may have a front surface 311 and a rear surface 312A. The distance between the front surface 311 and the rear surface 312A of the body portion 310A may be less than the distance between the front surface 311 and the initial rear surface 312. The thinning process may be performed through grinding, chemical mechanical polishing (CMP), and/or etch-back. Further, the thinning process may be performed so that a portion of the initial through electrode 350 may protrude from the rear surface 312A of the body portion 310A. The portion of the initial through electrode 350 that protrudes from the rear surface 312A of the body portion 310A will be referred to as a protrusion of the initial through electrode 350 (see P2).

Figure 3C:
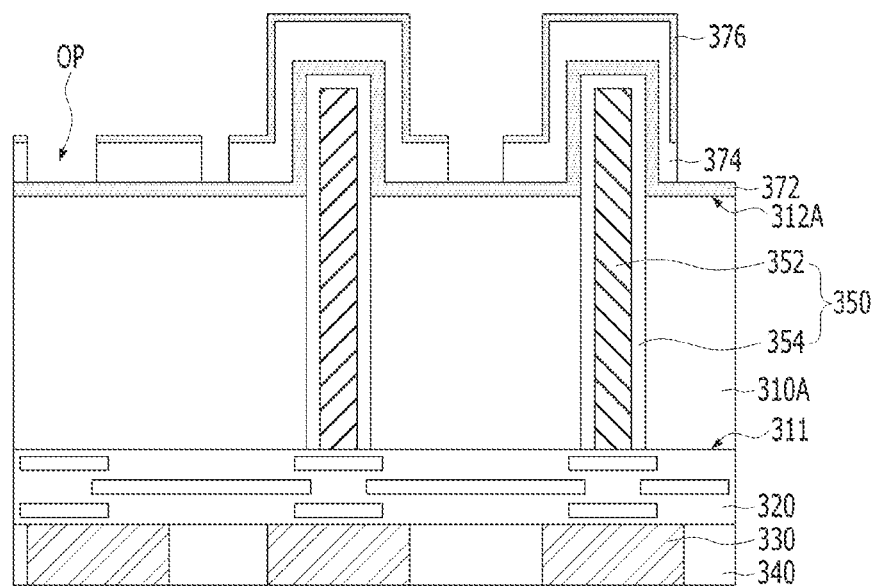

Referring to FIG. 3C, an initial first interlayer insulating layer 372 may be formed over the rear surface 312A of the body portion 310A and the protrusion of the initial through electrode 350. The initial first interlayer insulating layer 372 may be conformally formed along its lower profile. As an example, the initial first interlayer insulating layer 372 may include silicon nitride.

Subsequently, a stacked structure of an initial second interlayer insulating layer 374 and an initial third interlayer insulating layer 376 may be formed over the initial first interlayer insulating layer 372 along its lower profile. The stacked structure may have an opening OP that provides a space in which a power pattern is to be formed. The stacked structure may be formed by depositing insulting material layers for forming the initial second interlayer insulating layer 374 and the initial third interlayer insulating layer 376 over the initial first interlayer insulating layer 372 along its lower profile and removing the insulating material layers in a region corresponding to the opening OP through a mask and etching process. During this mask and etching process, the initial first interlayer insulating layer 372 may function as an etch stop layer. As an example, the initial second interlayer insulating layer 374 and the initial third interlayer insulating layer 376 may include silicon oxide and silicon nitride, respectively.

Figure 3D:
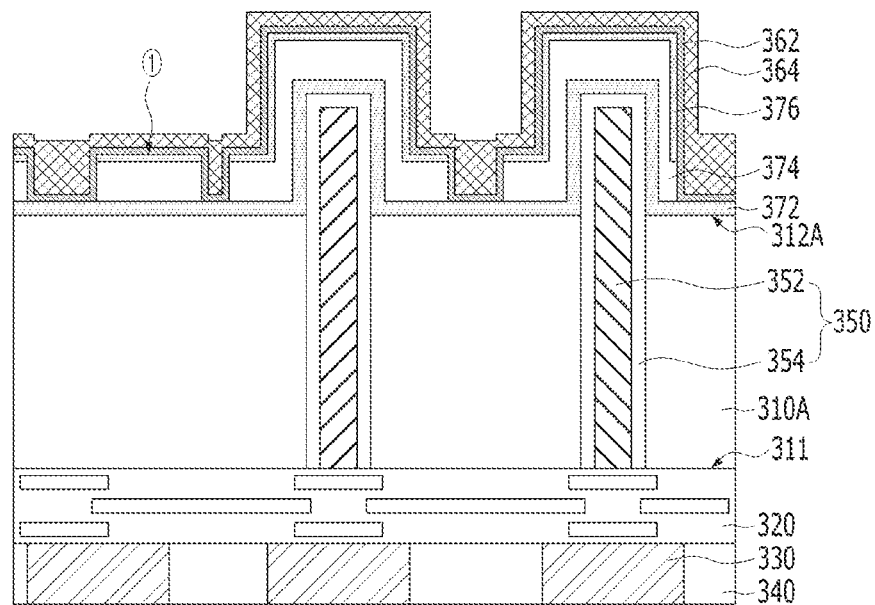

Referring to FIG. 3D, an initial metal-containing thin film layer 362 may be formed over the resultant structure of FIG. 3C along its lower profile. The initial metal-containing thin film layer 362 may include a metal or a metal compound, and may have a single-layered structure or a multi-layered structure. The initial metal-containing thin film layer 362 may be formed through deposition, or the like, and may be formed to have a thin thickness that does not completely fill the opening OP. The initial metal-containing thin film layer 362 may function to improve properties and/or forming processes of a metal-containing layer 364 to be described later.

Subsequently, the initial metal-containing layer 364 may be formed over the initial metal-containing thin film layer 362. The initial metal-containing layer 364 may include a metal or a metal compound and may have a single-layered structure or a multi-layered structure. The initial metal-containing layer 364 may be formed through deposition, electroplating, or the like, and may be formed to have a thickness that sufficiently fills the opening OP in which the initial metal-containing thin film layer 362 is formed.

Figure 3E:
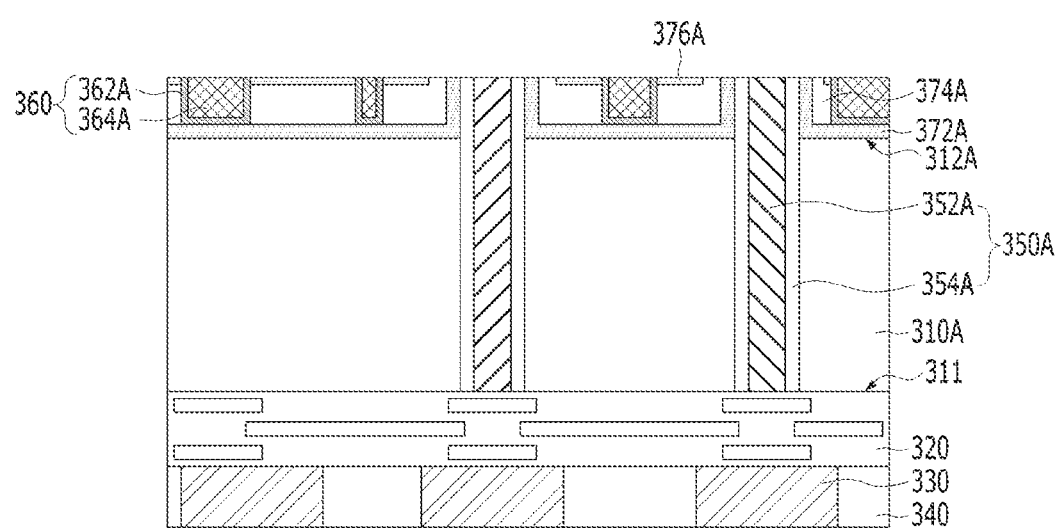

Referring to FIG. 3E, a planarization process may be performed on the resultant structure of FIG. 3D. The planarization process may be performed through chemical mechanical polishing or the like. In addition, the planarization process may be performed so that an upper surface of the initial third interlayer insulating layer 376 (see arrow ①) in FIG. 3D) is exposed except for the initial third interlayer insulating layer 376 that exists over the initial through electrode 350.

As a result of this process, a metal-containing thin film layer 362A, a metal-containing layer 364A, a first interlayer insulating layer 372A, a second interlayer insulating layer 374A, a third interlayer insulating layer 376A, and a through electrode 350A with a conductive pillar 352A and a spacer 354A, may be formed. The metal-containing thin film layer 362A, the metal-containing layer 364A, the first interlayer insulating layer 372A, the second interlayer insulating layer 374A, the third interlayer insulating layer 376A, and the through electrode 350A may form a flat surface. Shapes and functions of the metal-containing thin film layer 362A, the metal-containing layer 364A, the first interlayer insulating layer 372A, the second interlayer insulating layer 374A, the third interlayer insulating layer 376A, and the through electrode 350A will be more specifically described below.

The through electrode 350A with the conductive pillar 352A and the spacer 354A may substantially correspond to the through electrode 150 of FIG. 1B. The conductive pillar 352A may function as a path for signal transmission/power supply. The spacer 354A may surround a sidewall of the conductive pillar 352A to electrically insulate the body portion 310A and the conductive pillar 352A and/or to prevent metal diffusion from the conductive pillar 352A to the body portion 310A.

The metal-containing thin film layer 362A and the metal-containing layer 364A may correspond to the power pattern 160 of FIG. 1B. Accordingly, the metal-containing thin film layer 362A and the metal-containing layer 364A will be referred to as a power pattern 360. The metal-containing thin film layer 362A may be formed along a side surface and a lower surface of the above-described opening (see OP in FIG. 3C), and the metal-containing layer 364A may be provided to fill the opening in which the metal-containing thin film layer 362A is formed. Accordingly, a side surface and a lower surface of the metal-containing layer 364A may be surrounded by the metal-containing thin film layer 362A. As described above, the metal-containing thin film layer 362A may serve to improve the properties and/or forming processes of the metal-containing layer 364A. As an example, although not shown, the metal-containing thin film layer 362A may have a multi-layered structure with a barrier layer and a seed layer that is disposed over the barrier layer. The barrier layer may include a metal or a metal compound, such as titanium (Ti), titanium tungsten (TiW), titanium nitride (TiN), nickel vanadium (NiV), or the like, and the seed layer may include a metal, such as copper (Cu), or the like. In this case, the barrier layer may function to prevent metal diffusion between the power patterns 360 that may occur through the second interlayer insulating layer 374A, and the seed layer may function as a seed during electroplating for forming the metal-containing layer 364A.

The second and third interlayer insulating layers 374A and 376A may substantially correspond to the interlayer insulating layer of FIG. 1B. The first interlayer insulating layer 372A is not shown in FIG. 1B, but may be added to the semiconductor chip of FIG. 1B. The first interlayer insulating layer 372A may be formed along the rear surface 312A of the body portion 310A and the side surface of the protrusion of the through electrode 350A. The first interlayer insulating layer 372A may function to prevent metal diffusion between the protrusions of the through electrodes 350A or to prevent contamination by an external metal. The second and third interlayer insulating layers 374A and 376A may serve to insulate the power patterns 360 from each other and provide a space in which the power pattern 360 is to be formed. Furthermore, the third interlayer insulating layer 376A may function to prevent metal diffusion between the power patterns 360 that may occur through the second interlayer insulating layer 374A.

Figure 3F:
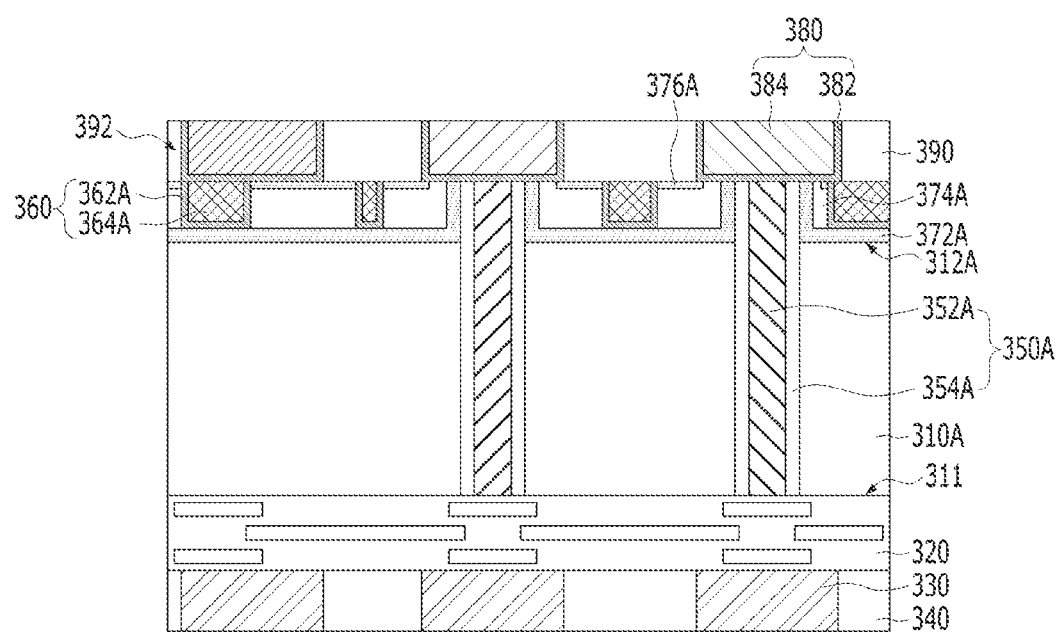

Referring to FIG. 3F, a rear insulating layer 390 with an opening 392 providing a space in which a rear connection electrode is to be formed, may be formed over the resultant structure of FIG. 3E. Although not shown, the rear insulating layer 390 may be formed by depositing an insulating material layer over the resultant structure of FIG. 3E and removing the insulating material layer in a region where the rear connection electrode is to be formed through a mask and etching process. The rear insulating layer 390 may include an insulating material, such as silicon oxide.

Subsequently, a rear connection electrode 380 that fills the opening 392 may be formed. The rear connection electrode 380 may include a metal-containing thin film layer 382 that is formed along a side surface and a lower surface of the opening 392 and a metal-containing layer 384 that fills the opening 392 in which the metal-containing thin film layer 382 is formed. Although not shown, the rear connection electrode 380 may be formed by depositing a thin metal material layer for forming the metal-containing thin film layer 382 along an upper surface of the rear insulating layer 390 and the side and lower surfaces of the opening 392, depositing another metal material layer with a thickness sufficient to fill the opening 392 over the thin metal material layer by deposition or electroplating, and performing a planarization process until the upper surface of the rear insulating layer 390 is exposed.

Accordingly, a semiconductor chip substantially the same as the semiconductor chip 100 of FIG. 1B may be fabricated.

Meanwhile, in the embodiment of FIGS. 3A to 3F, the power pattern 360 and the rear connection electrode 380 may all be formed by patterning an insulating layer to form a space in which the power pattern 360 and the rear connection electrode 380 are to be formed, and then filling the space with a conductive material that forms the power pattern 360 and the rear connection electrode 380. However, the present disclosure is not limited thereto, and a method of forming a power pattern and/or a rear connection electrode by patterning a conductive layer, and then filling the space between the patterned conductive layers with an insulating material, may be used. This will be exemplarily described with reference to FIGS. 4A to 4D below.

FIGS. 4A to 4D are cross-sectional views illustrating a method for fabricating a semiconductor chip according to another embodiment of the present disclosure. A description will be made focusing on differences from FIGS. 3A and 3B.

Figure 4A:
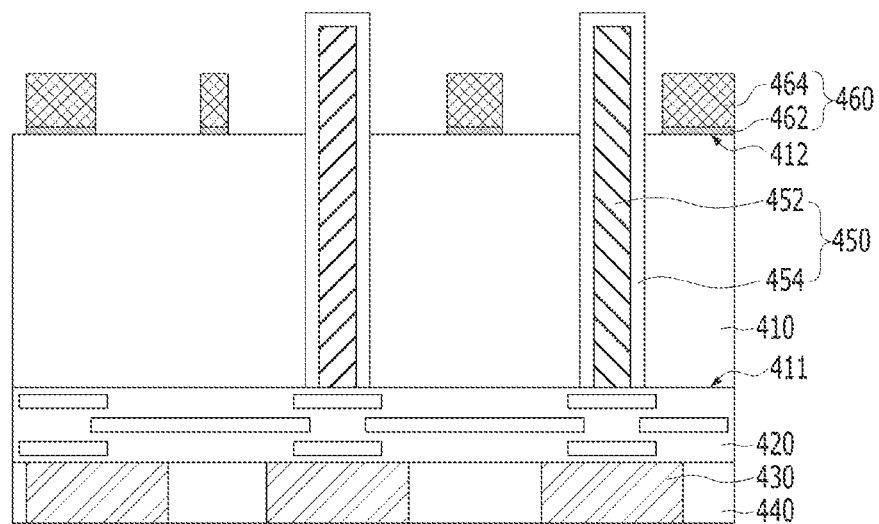
FIGS. 4A to 4D are cross-sectional views illustrating a method for fabricating a semiconductor chip according to another embodiment of the present disclosure.

Referring to FIG. 4A, a structure with a body portion 410 with a front surface 411 and a rear surface 412, an initial through electrode 450 that penetrates the body portion 410 and protrudes above the rear surface 412 of the body portion 410, a wiring portion 420 that is formed under the front surface 411 of the body portion 410, and a front connection electrode 430 and the front insulating layer 440 that are formed under the wiring portion 420, may be formed over a carrier substrate (not shown). The initial through electrode 450 may include an initial conductive pillar 452 and an initial spacer 454 that surrounds a side surface and an upper surface of the initial conductive pillar 452.

Subsequently, a power pattern 460 in which a metal-containing thin film layer 462 and a metal-containing layer 464 are stacked may be formed over the rear surface 412 of the body portion 410. Although not shown, the power pattern 460 may be formed by depositing material layers for forming the metal-containing thin film layer 462 and the metal-containing layer 464 over the rear surface 412 of the body portion 410, and patterning the material layers using a mask and etching process. Alternatively, although not shown, the power pattern 460 may be formed by depositing a material layer for forming the metal-containing thin film layer 462 over the rear surface 412 of the body portion 410, forming a photoresist pattern that provides a space in which the metal-containing layer 464 is to be formed, forming the metal-containing layer 464 in the space that is provided by the photoresist pattern through electroplating, removing the photoresist pattern, and removing the material layer that is exposed by the metal-containing layer 464. In this case, unlike the power pattern of the above-described embodiment (see 360 in FIG. 3E), the metal-containing thin film layer 462 may only contact a lower surface of the metal-containing layer 464.

Figure 4B:
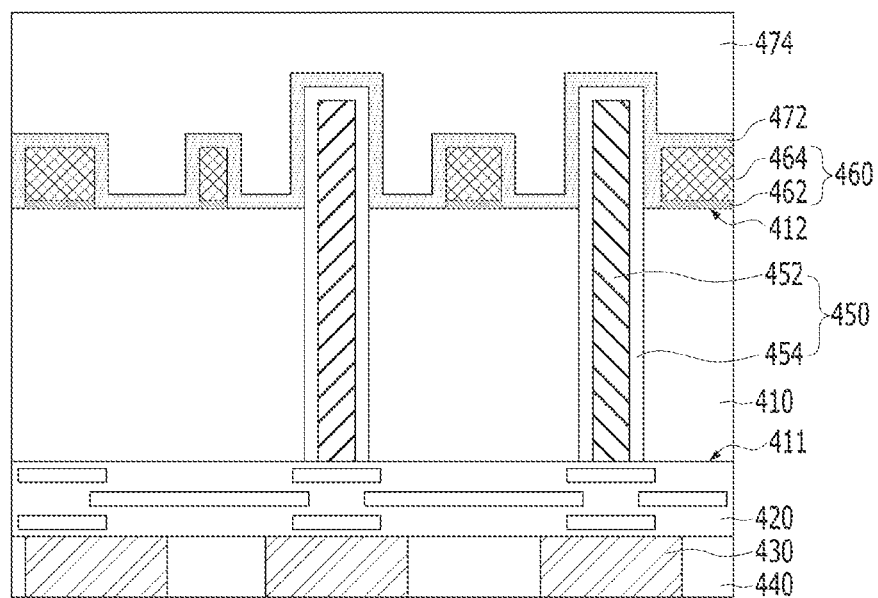

Referring to FIG. 4B, an initial first interlayer insulating layer 472 may be formed over the power pattern 460, the rear surface 412 of the body portion 410, and the protrusion of the initial through electrode 450 along its lower profile. As an example, the initial first interlayer insulating layer 472 may include silicon nitride.

Subsequently, an initial second interlayer insulating layer 474 may be formed over the initial first interlayer insulating layer 472 to a thickness that sufficiently covers the power pattern 460 and the protrusion of the initial through electrode 450. As an example, the initial second interlayer insulating layer 474 may include silicon oxide.

Figure 4C:
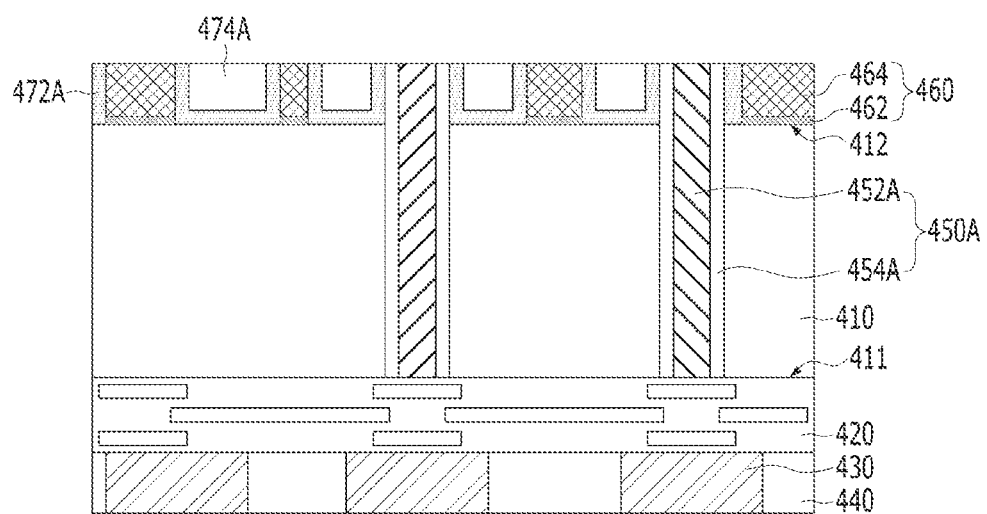

Referring to FIG. 4C, a planarization process may be performed on the resultant structure of FIG. 4B. This planarization process may be performed until an upper surface of the power pattern 460 is exposed.

As a result, a first interlayer insulating layer 472A and a second interlayer insulating layer 474A that fill the spaces between the power patterns 460, and a through electrode 450A with a conductive pillar 452A and a spacer 454A may be formed. The first interlayer insulating layer 472A may be formed along the rear surface 412 of the body portion 410, a side surface of the power pattern 460, and a side surface of the protrusion of the through electrode 450A. The first interlayer insulating layer 472A may function to prevent metal diffusion between the protrusion of the through electrode 450A and the power pattern 460.

Figure 4D:
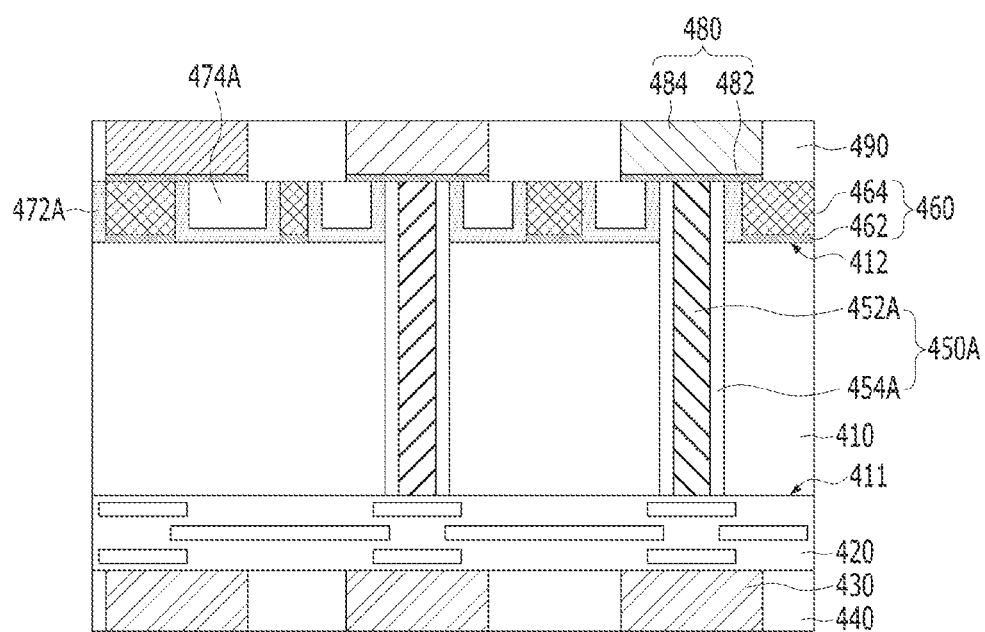

Referring to FIG. 4D, a rear connection electrode 480 may be formed over the resultant structure of FIG. 4C. The rear connection electrode 480 may include a stacked structure of a metal-containing thin film layer 482 and a metal-containing layer 484. Although not shown, the rear connection electrode 480 may be formed by depositing material layers for forming the metal-containing thin film layer 482 and the metal-containing layer 484 over the resultant structure of FIG. 4C, and patterning the material layers through a mask and etching process. Alternatively, although not shown, the rear connection electrode 480 may be formed by depositing a material layer for forming the metal-containing thin film layer 482 over the resultant structure of FIG. 4C, forming a photoresist pattern that provides a space in which and the metal-containing layer 484 is to be formed, forming the metal-containing layer 484 in the space that is provided by the photoresist pattern by electroplating, removing the photoresist pattern, and removing the material layer that is exposed by the metal-containing layer 484. In this case, unlike the rear connection electrode of the above-described embodiment (see 380 in FIG. 3F), the metal-containing thin film layer 482 may only contact a lower surface of the metal-containing layer 484.

Subsequently, a rear insulating layer 490 that fills the spaces between the rear connection electrodes 480 may be formed. Although not shown, the rear insulating layer 490 may be formed by depositing an insulating material layer with a thickness that is sufficient to cover the rear connection electrode 480 over the resultant structure of FIG. 4C, and performing a planarization process until an upper surface of the rear connection electrode 480 is exposed.

Accordingly, a semiconductor chip substantially the same as the semiconductor chip 100 of FIG. 1B may be fabricated.

Figure 5A:
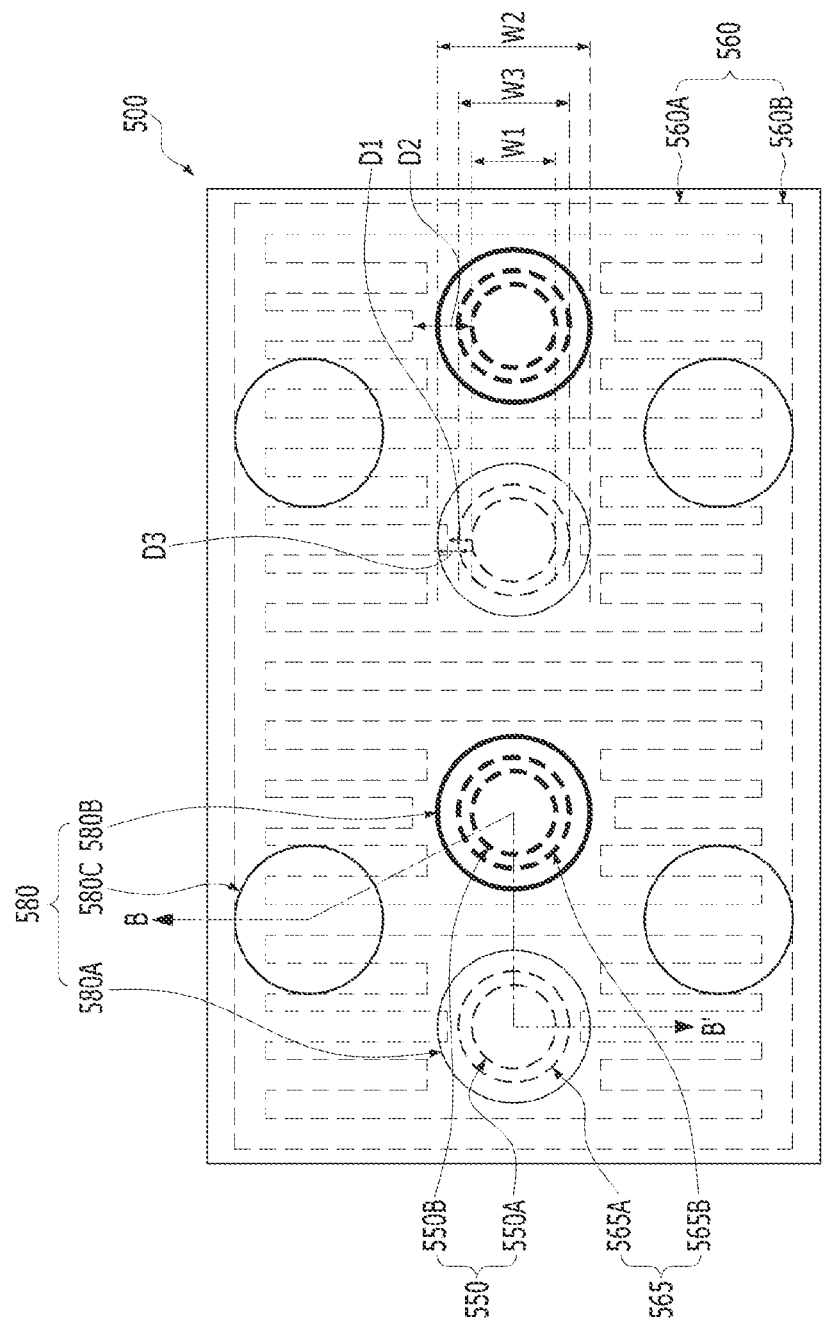
FIGS. 5A and 5B are views illustrating a semiconductor chip according to another embodiment of the present disclosure.
Figure 5B:
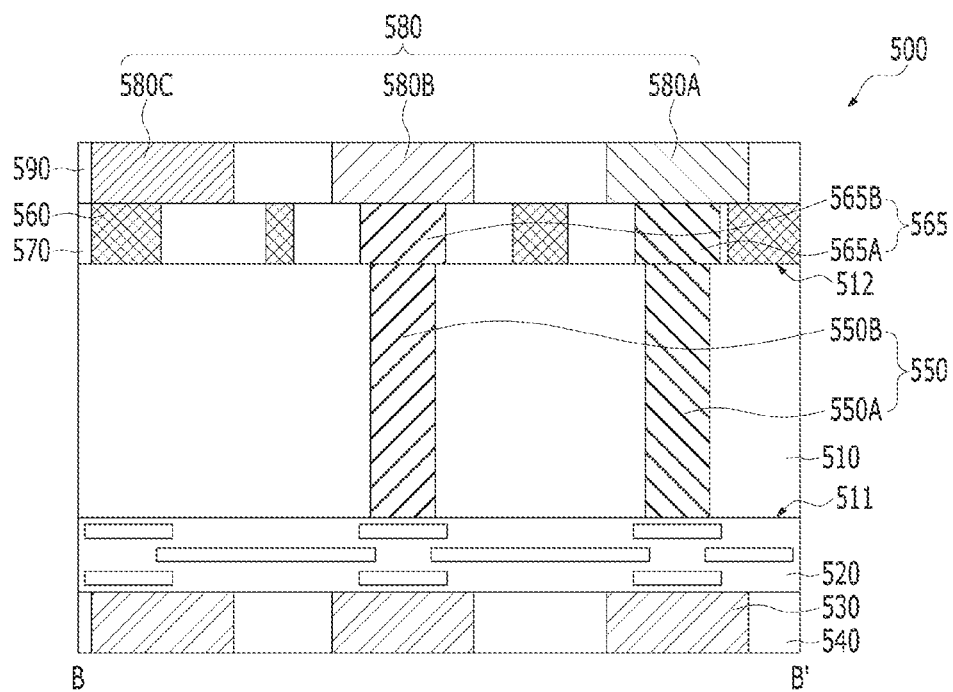

FIGS. 5A and 5B are views illustrating a semiconductor chip according to another embodiment of the present disclosure. FIG. 5A is a plan view of the semiconductor chip of the present embodiment as viewed from above, and FIG. 5B is a cross-sectional view taken along a line B-B' of FIG. 5A. In FIG. 5A, for convenience of description, a through electrode, a connection pattern, and a power pattern disposed under a rear connection electrode are shown in dotted lines, together with the rear connection electrode disposed at the uppermost portion of the semiconductor chip. A description will be made focusing on differences from the embodiment of FIGS. 1A and 1B described above.

Referring to FIGS. 5A and 5B, a semiconductor chip 500 of the present embodiment may include a body portion 510, a wiring portion 520, a front connection electrode 530, a front insulating layer 540, a through electrode 550, a power pattern 560, a connection pattern 565, an interlayer insulating layer 570, a rear connection electrode 580, and a rear insulating layer 590.

The body portion 510 may have a front surface 511 and a rear surface 512. The wiring portion 520 may be formed under the front surface 511 of the body portion 510. The front connection electrode 530 and the front insulating layer 540 may be formed under the wiring portion 520.

The through electrode 550 may have a pillar shape that extends from the front surface 511 to the rear surface 512 of the body portion 510 to penetrate the body portion 510. One end of the through electrode 550 may be connected to the wiring portion 520, and the other end of the through electrode 550 may be connected to the connection pattern 565. In a plan view, the width of each through electrode 550 is indicated by a reference numeral W1. The through electrode 550 may include a first through electrode 550A that is electrically connected to the power pattern 560 and a second through electrode 550B that is not electrically connected to the power pattern 560.

The power pattern 560 may be formed over the rear surface 512 of the body portion 510 to be spaced apart from the through electrode 550 in the horizontal direction. The power pattern 560 may be electrically connected to the first through electrode 550A through the first rear connection electrode 580A and may be electrically insulated from the second through electrode 550B.

The connection pattern 565 may be formed at the same level as the power pattern 560 in a vertical direction. That is, the connection pattern 565 may be formed over the rear surface 512 of the body portion 510. The connection pattern 565 may be formed to overlap and connect with each through electrode 550. The connection pattern 565 and the through electrode 550 may correspond to each other in one-to-one correspondence. The connection pattern 565 may include a first connection pattern 565A that is connected to the first through electrode 550A, and a second connection pattern 565B that is connected to the second through electrode 550B.

The width W3 of the connection pattern 565 may be greater than the width W1 of the through electrode 550 and may be smaller than the width W2 of the rear connection electrode 580. In the present embodiment, the first connection pattern 565A may be spaced apart from the power pattern 560 adjacent thereto by a predetermined minimum distance D3, but the present disclosure is not limited thereto, and a side surface of the first connection pattern 565A and a side surface of the power pattern 560 adjacent thereto may contact each other. On the other hand, the second connection pattern 565B may be spaced apart from the power pattern 560 adjacent thereto. That is, a side surface of the second connection pattern 565B and a side surface of the power pattern 560 adjacent thereto might not contact. The connection pattern 565 may be formed of the same metal or metal compound as the power pattern 560.

The interlayer insulating layer 570 may be formed over the rear surface 512 of the body portion 510 to fill the space between the power pattern 560 and the connection pattern 565.

The rear connection electrode 580 may include a first rear connection electrode 580A that is connected to the first connection pattern 565A, a second rear connection electrode 580B that is connected to the second connection pattern 565B, and a third rear connection electrode 580C that is not connected to the connection pattern 565.

The first rear connection electrode 580A may be formed to overlap and connect with each first connection pattern 565A. Accordingly, the first through electrode 550A may be electrically connected to the first rear connection electrode 580A through the first connection pattern 565A. Furthermore, the first rear connection electrode 580A may overlap and connect with the first connection pattern 565A and a part of the power pattern 560 adjacent thereto at the same time. To this end, the width W2 of the first rear connection electrode 580A may have a value that is greater than the sum of the width W3 of the first connection pattern 565A, and the minimum distance D3 between the first connection pattern 565A and the power pattern 560 adjacent thereto. As a result, the first rear connection electrode 580A may electrically connect the first connection pattern 565A to the power pattern 560.

The second rear connection electrode 580B may be formed to overlap and connect with each second connection pattern 565B. Accordingly, the second through electrode 550B may be electrically connected to the second rear connection electrode 580B through the second connection pattern 565B. The second rear connection electrode 580B may be electrically insulated from the power pattern 560 by not overlapping/connecting with the power pattern 560 around the second connection pattern 565B.

The third rear connection electrode 580C may be formed to be spaced apart from the first and second rear connection electrodes 580A and 580B without overlapping or connecting with the connection pattern 565. That is, the third rear connection electrode 580C may be a dummy that is not used for signal transmission or power supply.

The rear insulating layer 590 may be formed over a flat surface that is formed based on one surface of the connection pattern 565, one surface of the power pattern 560, and one surface of the interlayer insulating layer 570 to fill the spaces between the rear connection electrodes 580.

Even with the semiconductor chip 500 described above, the effect of the semiconductor chip (see 100 in FIGS. 1A and 1B) of the above-described embodiment may be obtained. That is, because the first rear connection electrode 580A is connected to the corresponding first connection pattern 565A and the power pattern 560 adjacent thereto at the same time, the power supply through these elements may be easily and stably performed.

In addition, when a plurality of semiconductor chips 500 are stacked in the vertical direction, a hybrid bonding structure for firmly bonding adjacent semiconductor chips 500 in the vertical direction may be provided. That is, because the power pattern 560 and the connection pattern 565 are disposed under the rear connection electrode 580, the power pattern 560 and the connection pattern 565 might not adversely affect bonding in a case that the rear connection electrode 580 and the rear insulating layer 590 are respectively bonded to a front connection electrode and a front insulating layer of another semiconductor chip (not shown).

FIGS. 6A to 6D are cross-sectional views illustrating a method for fabricating a semiconductor chip according to another embodiment of the present disclosure.

Figure 6A:
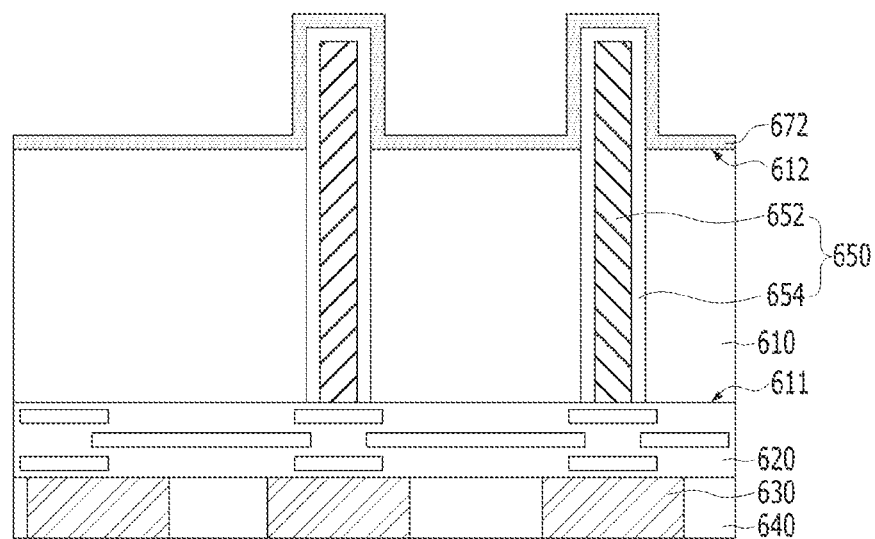
FIGS. 6A to 6D are cross-sectional views illustrating a method for fabricating a semiconductor chip according to another embodiment of the present disclosure.

Referring to FIG. 6A, a structure with a body portion 610 with a front surface 611 and a rear surface 612, a wiring portion 620 that is formed under the front surface 611 of the body portion 610, a front connection electrode 630 and a front insulating layer 640 that are formed under the wiring portion 620, and an initial through electrode 650 that penetrates the body portion 610 and protrudes above the rear surface 612 of the body portion 610 while being connected to the wiring portion 620, may be formed over a carrier substrate (not shown). The initial through electrode 650 may include an initial conductive pillar 652 and an initial spacer 654.

Subsequently, an initial first interlayer insulating layer 672 may be formed over the rear surface 612 of the body portion 610 and the protrusion of the initial through electrode 650 along its lower profile. As an example, the initial first interlayer insulating layer 672 may include silicon nitride.

Figure 6B:
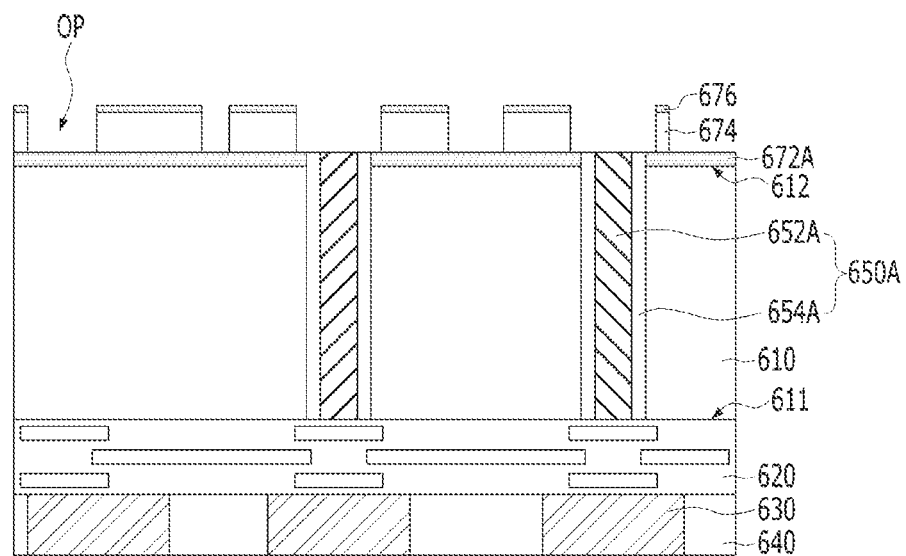

Referring to FIG. 6B, by performing a planarization process so that an upper surface of the initial first interlayer insulating layer 672 that exists over the rear surface 612 of the initial body portion 610 is exposed, a through electrode 650A with a conductive pillar 652A and a spacer 654A, and a first interlayer insulating layer 672A may be formed.

As a result of this process, the through electrode 650A may have a pillar shape that penetrates the body portion 610 and the first interlayer insulating layer 672A. An upper surface of the first interlayer insulating layer 672A and one surface of the through electrode 650A may form a flat surface.

Subsequently, a stacked structure of a second interlayer insulating layer 674 and a third interlayer insulating layer 676 with an opening OP that provides a space in which a power pattern and a connection pattern are to be formed, may be formed over the first interlayer insulating layer 672A. As an example, the second interlayer insulating layer 674 and the third interlayer insulating layer 676 may include silicon oxide and silicon nitride, respectively.

Figure 6C:
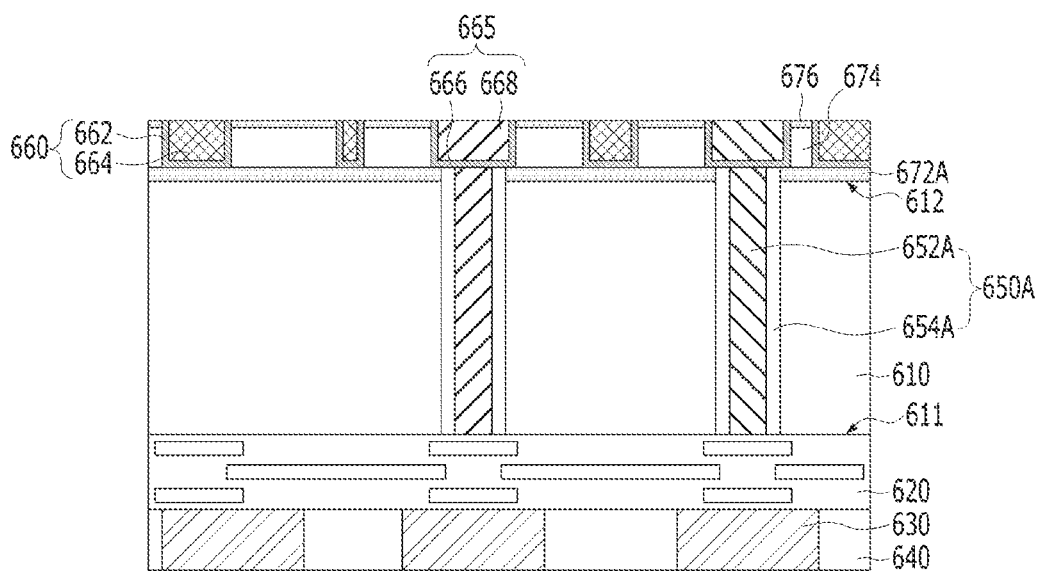

Referring to FIG. 6C, a power pattern 660 and a connection pattern 665, filled in the openings of the second interlayer insulating layer 674 and the third interlayer insulating layer 676, may be formed. The power pattern 660 may include a metal-containing thin film layer 662 and a metal-containing layer 664, and the metal-containing thin film layer 662 may surround a side surface and a lower surface of the metal-containing layer 664. The connection pattern 665 may include a metal-containing thin film layer 666 and a metal-containing layer 668, and the metal-containing thin film layer 666 may surround a side surface and a lower surface of the metal-containing layer 668.

Figure 6D:
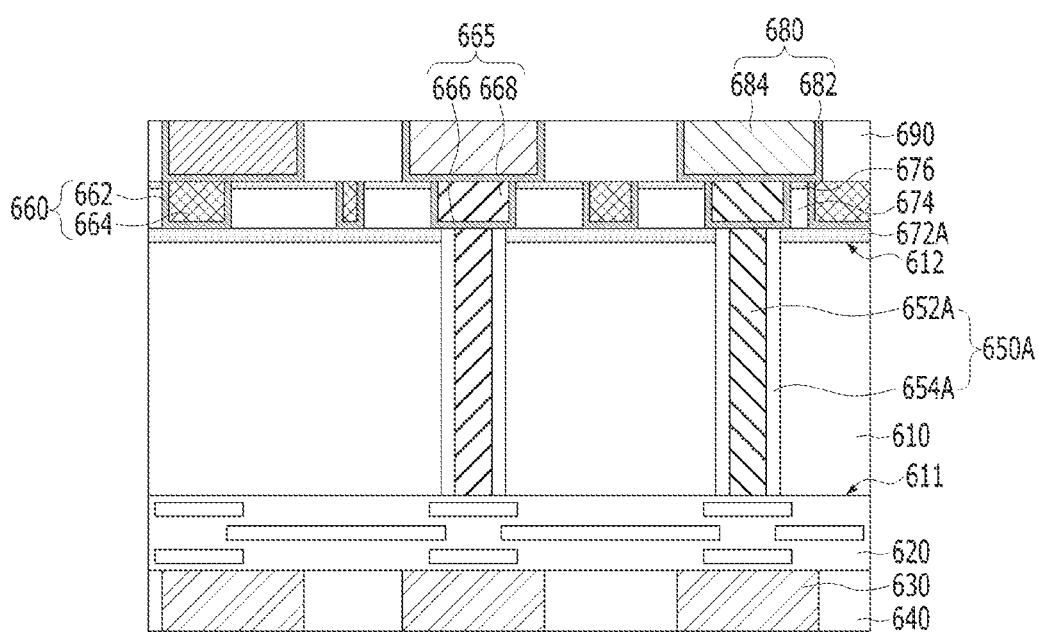

Referring to FIG. 6D, a rear insulating layer 690 with an opening that provides a space for forming a rear connection electrode 680 and the rear connection electrode 680 that is formed in the opening of the rear insulating layer 690 may be formed over the resultant structure of FIG. 6C. The rear connection electrode 680 may include a metal-containing thin film layer 682 and a metal-containing layer 684, and the metal-containing thin film layer 682 may surround a side surface and a lower surface of the metal-containing layer 684.

Accordingly, a semiconductor chip substantially the same as the semiconductor chip 100 of FIG. 5B may be fabricated.

Figure 7A:
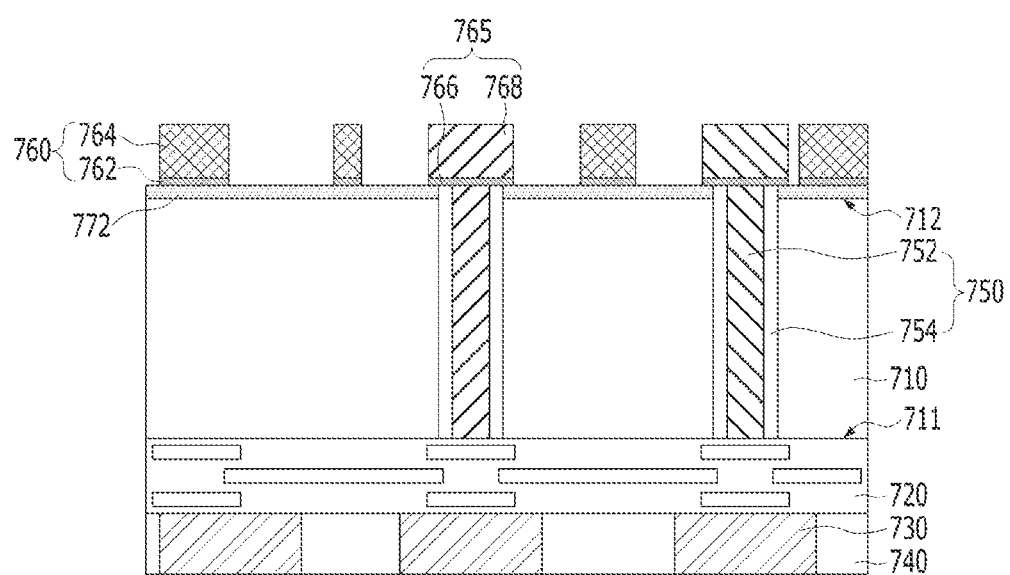
FIGS. 7A to 7C are cross-sectional views illustrating a method of manufacturing a semiconductor chip according to another exemplary embodiment of the present disclosure.
Figure 7B:
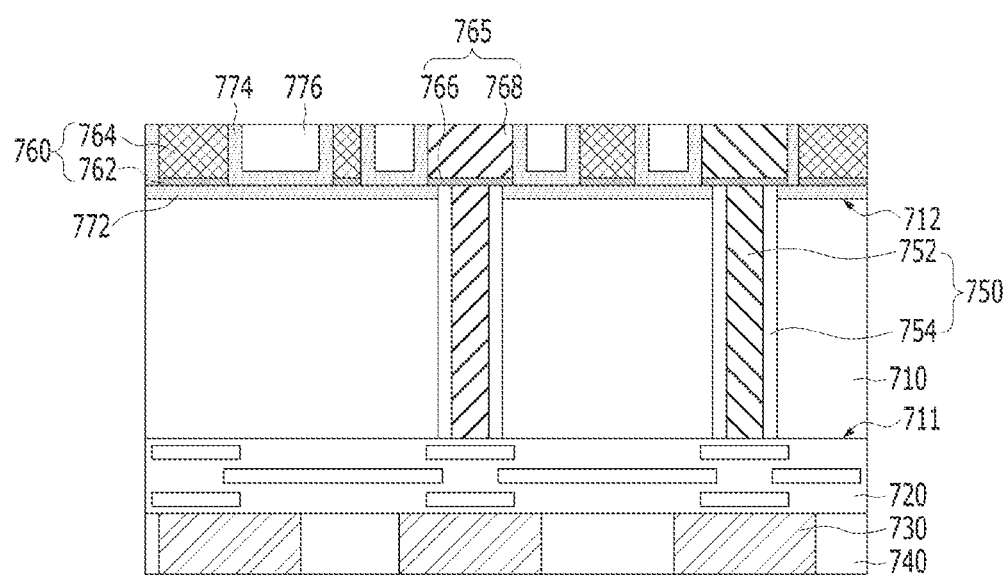
Figure 7C:
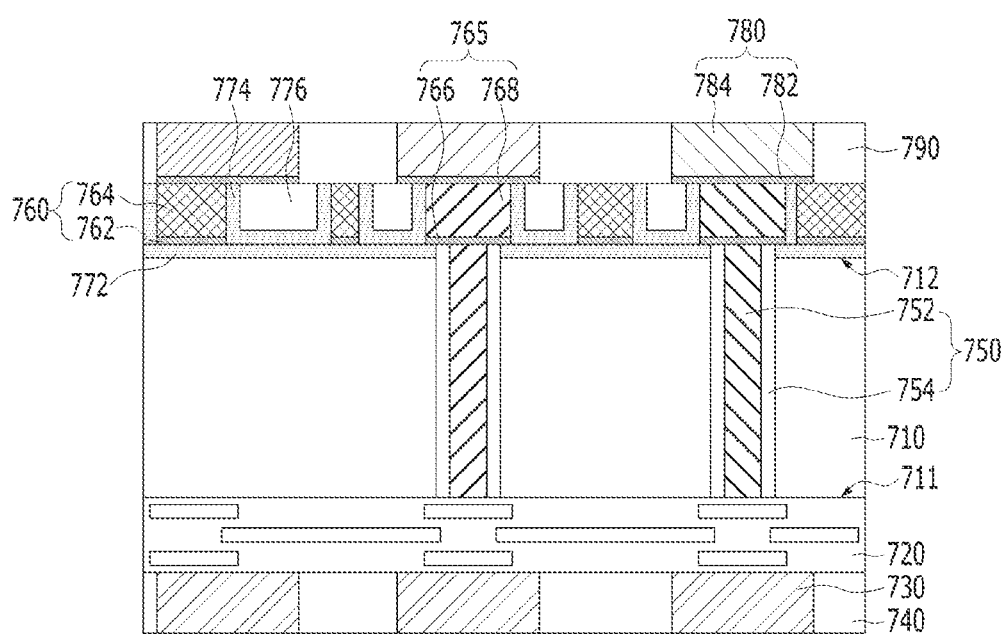

FIGS. 7A to 7C are cross-sectional views illustrating a method of manufacturing a semiconductor chip according to another exemplary embodiment of the present disclosure.

Referring to FIG. 7A, a structure with a body portion 710 that has a front surface 711 and a rear surface 712, a wiring portion 720 that is formed under the front surface 711 of the body portion 710, a front connection electrode 730 and a front insulating layer 740 that is formed under the wiring portion 720, a first interlayer insulating layer 772 that is formed over the rear surface 712 of the body portion 710, and a through electrode 750 that penetrates the body portion 710 and the first interlayer insulating layer 772, may be formed over a carrier substrate (not shown). The through electrode 750 may include a conductive pillar 752 and a spacer 754.

Subsequently, a power pattern 760 in which a metal-containing thin film layer 762 and a metal-containing layer 764 are stacked, and a connection pattern 765 in which a metal-containing thin film layer 766 and a metal-containing layer 768 are stacked, may be formed over the rear surface 712 of the body portion 710.

Referring to FIG. 7B, second and third interlayer insulating layers 774 and 776 may be formed to fill the spaces between the power pattern 760 and the connection pattern 765. The second interlayer insulating layer 774 may include, for example, silicon nitride, and may be formed along a side surface of the power pattern 760, a side surface of the connection pattern 765, and an upper surface of the first interlayer insulating layer 772. The third interlayer insulating layer 776 may include, for example, silicon oxide, and may have a side surface and a lower surface that is surrounded by the second interlayer insulating layer 774.

Referring to FIG. 7C, a rear connection electrode 780 may be formed over the resultant structure of FIG. 7B. The rear connection electrode 780 may include a stacked structure of a metal-containing thin film layer 782 and a metal-containing layer 784.

Subsequently, a rear insulating layer 790 that fills the spaces between the rear connection electrodes 780 may be formed.

Accordingly, a semiconductor chip substantially the same as the semiconductor chip 500 of FIG. 5B may be fabricated.

According to the above embodiments of the present disclosure, it may be possible to provide a semiconductor chip capable of improving operating characteristics and facilitating fabricating processes, and a semiconductor package including the same.

Figure 8:
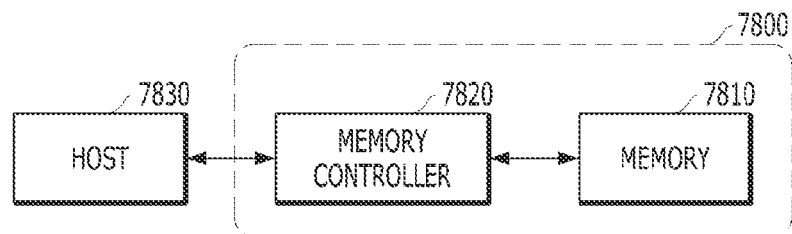
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
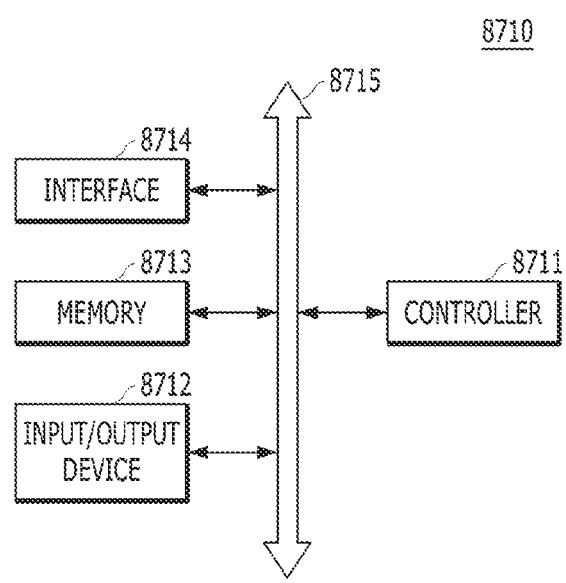
FIG. 9 shows a block diagram illustrating another electronic system including a semiconductor package, according to an embodiment

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor chip comprising:
a body portion with a front surface and a rear surface, the body portion being oriented in such a way that the rear surface is above the front surface;
first and second through electrodes penetrating the body portion with protrusions that protrude above the rear surface of the body portion;
a power pattern formed over the rear surface of the body portion and spaced apart from the protrusions;
an interlayer insulating layer filling spaces between the power pattern and the protrusions; and
first and second rear connection electrodes formed over the interlayer insulating layer and respectively connected to the first and second through electrodes,
wherein the first rear connection electrode is simultaneously connected to the first through electrode and a part of the power pattern that is adjacent to the first through electrode, and
wherein the second rear connection electrode is not connected to the power pattern.

2. The semiconductor chip according to claim 1, wherein a width of the first rear connection electrode is greater than a sum of a width of the first through electrode and a minimum distance between the first through electrode and the power pattern that is adjacent to the first through electrode.

3. The semiconductor chip according to claim 1, wherein a width of the second rear connection electrode is smaller than a sum of a width of the second through electrode and a minimum distance between the second through electrode and the power pattern that is adjacent to the second through electrode.

4. The semiconductor chip according to claim 1, further comprising:
a third rear connection electrode, formed over the interlayer insulating layer, not connected to the first and second through electrodes.

5. The semiconductor chip according to claim 1, further comprising:
a rear insulating layer formed over the interlayer insulating layer and the power pattern, filling a space between the first and second rear connection electrodes.

6. The semiconductor chip according to claim 1, further comprising:
a wiring portion formed under the front surface of the body portion;
front connection electrodes formed under the wiring portion and respectively connected to the first and second through electrodes through the wiring portion; and
a front insulating layer formed under the wiring portion, filling a space between the front connection electrodes.

7. The semiconductor chip according to claim 1, wherein the power pattern includes a metal-containing layer and a metal-containing thin film layer that surrounds a side surface and a lower surface of the metal-containing layer.

8. The semiconductor chip according to claim 1, wherein the power pattern includes a metal-containing thin film layer and a metal-containing layer that is formed over the metal-containing thin film layer.

9. The semiconductor chip according to claim 1, wherein each of the first and second rear connection electrodes includes a metal-containing layer and a metal-containing thin film layer that surrounds a side surface and a lower surface of the metal-containing layer.

10. The semiconductor chip according to claim 1, wherein each of the first and second rear connection electrodes includes a metal-containing thin film layer and a metal-containing layer that is formed over the metal-containing thin film layer.

11. The semiconductor chip according to claim 1, wherein the interlayer insulating layer includes a silicon oxide layer and a silicon nitride layer that is formed over the silicon oxide layer.

12. The semiconductor chip according to claim 1, further comprising:
a silicon nitride layer disposed under the interlayer insulating layer and the power pattern, and formed along the rear surface of the body portion and side surfaces of the protrusions.

13. The semiconductor chip according to claim 1, wherein the interlayer insulating layer includes a silicon nitride layer that is formed along a side surface of the power pattern, side surfaces of the protrusions, and the rear surface of the body portion, and includes a silicon oxide layer with a side surface and a lower surface that are surrounded by the silicon nitride layer.

14. The semiconductor chip according to claim 1, wherein the first rear connection electrode is in direct contact with the first through electrode and the power pattern.

15. The semiconductor chip according to claim 1, wherein the power pattern includes a plurality of line patterns and an extension pattern that connects the plurality of line patterns to each other, and
wherein the plurality of line patterns are alternately arranged with the interlayer insulating layer.

16. A semiconductor package comprising:
a first semiconductor chip including a body portion with a front surface and a rear surface, the body portion being oriented in such a way that the rear surface is above the front surface, first and second through electrodes penetrating the body portion with protrusions that protrude above the rear surface of the body portion, a power pattern formed over the rear surface of the body portion and spaced apart from the protrusions, an interlayer insulating layer filling spaces between the power pattern and the protrusions, first and second rear connection electrodes formed over the interlayer insulating layer and respectively connected to the first and second through electrodes, and a rear insulating layer formed over the interlayer insulating layer and the power pattern, filling a space between the first and second rear connection electrodes, wherein the first rear connection electrode is simultaneously connected to the first through electrode and a part of the power pattern that is adjacent to the first through electrode; and
a second semiconductor chip including front connection electrodes directly bonded to the first and second rear connection electrodes, respectively, and a front insulating layer directly bonded to the rear insulating layer while filling spaces between the front connection electrodes.

17. The semiconductor package according to claim 16, wherein power is supplied to the first semiconductor chip and the second semiconductor chip through the first through electrode, the power pattern, the first rear connection electrode, and the front connection electrode that is connected to the first rear connection electrode, and
wherein a signal is transmitted to the first semiconductor chip and the second semiconductor chip through the second through electrode, the second rear connection electrode, and the front connection electrode that is connected to the second rear connection electrode.

18. The semiconductor package according to claim 16, wherein power that is supplied to the first semiconductor chip and the second semiconductor chip through the first through electrode, the power pattern, the first rear connection electrode, and the front connection electrode that is connected to the first rear connection electrode, is different from power that is supplied to the first semiconductor chip and the second semiconductor chip through the second through electrode, the second rear connection electrode, and the front connection electrode that is connected to the second rear connection electrode.

19. The semiconductor package according to claim 16, wherein the first and second rear connection electrodes and the front connection electrodes are formed of the same material, and
wherein the rear insulating layer and the front insulating layer are formed of the same material.

20. A semiconductor chip comprising:
a body portion with a front surface and a rear surface, the body portion being oriented in such a way that the rear surface is above the front surface;
first and second through electrodes penetrating the body portion;
a power pattern formed over the rear surface of the body portion and spaced apart from the first and second through electrodes;
first and second connection patterns formed over the rear surface of the body portion and respectively connected to the first and second through electrodes;
an interlayer insulating layer filling spaces between the power pattern and the first and second connection patterns; and
first and second rear connection electrodes formed over the interlayer insulating layer and respectively connected to the first and second connection patterns,
wherein the first rear connection electrode is simultaneously connected to the first connection pattern and a part of the power pattern that is adjacent to the first connection pattern, and
wherein the second connection pattern is spaced apart from the power pattern.

21. The semiconductor chip according to claim 20, wherein a width of each of the first and second connection patterns is greater than a width of each of the first and second through electrodes, and
wherein the width of each of the first and second connection patterns is smaller than a width of each of the first and second rear connection electrodes.

22. The semiconductor chip according to claim 20, wherein a width of the first rear connection electrode is greater than a sum of a width of the first connection pattern and a minimum distance between the first connection pattern and the power pattern that is adjacent to the first connection pattern.

23. The semiconductor chip according to claim 20, further comprising:

a third rear connection electrode, formed over the interlayer insulating layer, not connected to the first and second connection patterns.

24. The semiconductor chip according to claim 20, further comprising:
a rear insulating layer formed over the interlayer insulating layer and the power pattern, filling a space between the first and second rear connection electrodes.

25. The semiconductor chip according to claim 20, further comprising:
a wiring portion formed under the front surface of the body portion;
front connection electrodes formed under the wiring portion and respectively connected to the first and second through electrodes through the wiring portion; and
a front insulating layer formed under the wiring portion, filling a space between the front connection electrodes.

26. The semiconductor chip according to claim 20, wherein each of the power pattern and the first and second connection patterns includes a metal-containing layer and a metal-containing thin film layer that surrounds a side surface and a lower surface of the metal-containing layer.

27. The semiconductor chip according to claim 20, wherein each of the power pattern and the first and second connection patterns includes a metal-containing thin film layer and a metal-containing layer that is formed over the metal-containing thin film layer.

28. The semiconductor chip according to claim 20, wherein each of the first and second rear connection electrodes includes a metal-containing layer and a metal-containing thin film layer that surrounds a side surface and a lower surface of the metal-containing layer.

29. The semiconductor chip according to claim 20, wherein each of the first and second rear connection electrodes includes a metal-containing thin film layer and a metal-containing layer that is formed over the metal-containing thin film layer.

30. The semiconductor chip according to claim 20, wherein the interlayer insulating layer includes a silicon oxide layer and a silicon nitride layer that is formed over the silicon oxide layer.

31. The semiconductor chip according to claim 20, further comprising:
a silicon nitride layer disposed under the interlayer insulating layer, the power pattern, and the first and second connection patterns, and formed over the rear surface of the body portion, and
wherein the first and second through electrodes further penetrate the silicon nitride layer.

32. The semiconductor chip according to claim 20, wherein the interlayer insulating layer includes a silicon nitride layer that is formed along a side surface of the power pattern, side surfaces of the first and second connection patterns, and the rear surface of the body portion, and includes a silicon oxide layer with a side surface and a lower surface that are surrounded by the silicon nitride layer.

33. The semiconductor chip according to claim 20, wherein the first rear connection electrode is in direct contact with the first connection pattern and the power pattern.

34. The semiconductor chip according to claim 20, wherein the power pattern includes a plurality of line patterns and an extension pattern that connects the plurality of line patterns to each other, and wherein the plurality of line patterns are alternately arranged with the interlayer insulating layer.

35. A semiconductor package comprising:
a first semiconductor chip including a body portion with a front surface and a rear surface, the body portion being oriented in such a way that the rear surface is above the front surface, first and second through electrodes penetrating the body portion, a power pattern formed over the rear surface of the body portion and spaced apart from the first and second through electrodes; first and second connection patterns formed over the rear surface of the body portion and respectively connected to the first and second through electrodes, an interlayer insulating layer filling spaces between the power pattern and the first and second connection patterns, first and second rear connection electrodes formed over the interlayer insulating layer and respectively connected to the first and second connection patterns, and a rear insulating layer formed over the interlayer insulating layer and the power pattern, filling a space between the first and second rear connection electrodes, where the first rear connection electrode is simultaneously connected to the first through electrode and a part of the power pattern that is adjacent to the first through electrode; and
a second semiconductor chip including front connection electrodes directly bonded to the first and second rear connection electrodes, respectively, and a front insulating layer directly bonded to the rear insulating layer while filling spaces between the front connection electrodes.

36. The semiconductor package according to claim 35, wherein power is supplied to the first semiconductor chip and the second semiconductor chip through the first through electrode, the first connection pattern, the power pattern, the first rear connection electrode, and the front connection electrode that is connected to the first rear connection electrode, and
wherein a signal is transmitted to the first semiconductor chip and the second semiconductor chip through the second through electrode, the second connection pattern, the second rear connection electrode, and the front connection electrode that is connected to the second rear connection electrode.

37. The semiconductor package according to claim 35, wherein power that is supplied to the first semiconductor chip and the second semiconductor chip through the first through electrode, the first connection pattern, the power pattern, the first rear connection electrode, and the front connection electrode that is connected to the first rear connection electrode, is different from power that is supplied to the first semiconductor chip and the second semiconductor chip through the second through electrode, the second connection pattern, the second rear connection electrode, and the front connection electrode that is connected to the second rear connection electrode.

38. The semiconductor package according to claim 35, wherein the first and second rear connection electrodes and the front connection electrodes are formed of the same material, and
wherein the rear insulating layer and the front insulating layer are formed of the same material.

* * * * *